(12) United States Patent
Kim et al.

(10) Patent No.: US 12,293,989 B2
(45) Date of Patent: May 6, 2025

(54) SEMICONDUCTOR PACKAGE

(71) Applicant: SAMSUNG ELECTRONICS CO., LTD., Suwon-si (KR)

(72) Inventors: Minjung Kim, Cheonan-si (KR); Dongkyu Kim, Anyang-si (KR); Jongyoun Kim, Seoul (KR); Seokhyun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 293 days.

(21) Appl. No.: 17/680,857

(22) Filed: Feb. 25, 2022

(65) Prior Publication Data

US 2023/0065378 A1    Mar. 2, 2023

(30) Foreign Application Priority Data

Aug. 24, 2021  (KR) .................. 10-2021-0111542

(51) Int. Cl.
| | |
|---|---|
| H01L 25/065 | (2023.01) |
| H01L 23/00 | (2006.01) |
| H01L 23/48 | (2006.01) |
| H01L 23/498 | (2006.01) |
| H01L 25/10 | (2006.01) |

(52) U.S. Cl.
CPC ........ *H01L 25/0657* (2013.01); *H01L 23/481* (2013.01); *H01L 23/49816* (2013.01); *H01L 23/49822* (2013.01); *H01L 24/06* (2013.01); *H01L 24/16* (2013.01); *H01L 24/17* (2013.01); *H01L 24/81* (2013.01); *H01L 25/105* (2013.01); *H01L 2224/0401* (2013.01); *H01L 2224/06181* (2013.01); *H01L 2224/16146* (2013.01); *H01L 2224/16235* (2013.01); *H01L 2224/17181* (2013.01); *H01L 2225/06517* (2013.01); *H01L 2924/3511* (2013.01)

(58) Field of Classification Search
CPC .................................................. H01L 25/0657
See application file for complete search history.

(56) References Cited

U.S. PATENT DOCUMENTS

| | | | |
|---|---|---|---|
| 7,838,337 B2 * | 11/2010 | Marimuthu | ......... H01L 21/6835 257/E21.511 |
| 9,666,572 B2 | 5/2017 | Lin et al. | |
| 9,773,757 B2 * | 9/2017 | Yu | ............. H01L 24/19 |
| 10,157,852 B2 * | 12/2018 | Yu | ............. H01L 24/19 |
| 10,319,688 B2 | 6/2019 | Wolter et al. | |
| 10,586,786 B2 | 3/2020 | Delacruz et al. | |
| 10,651,137 B2 | 5/2020 | Yu et al. | |
| 10,784,248 B2 | 9/2020 | Yu et al. | |
| 10,950,556 B2 | 3/2021 | Wu et al. | |

(Continued)

*Primary Examiner* — William A Harriston
(74) *Attorney, Agent, or Firm* — Fish & Richardson P.C.

(57) ABSTRACT

A semiconductor package includes a first redistribution substrate, a lower semiconductor chip on the first redistribution substrate and a through via therein, a first lower conductive structure and a second lower conductive structure that are on the first redistribution substrate and are laterally spaced apart from the lower semiconductor chip, an upper semiconductor chip on the lower semiconductor chip and the second lower conductive structure and coupled to the through via and the second lower conductive structure, and an upper conductive structure on the first lower conductive structure. A width of the second lower conductive structure is greater than a width of the through via.

20 Claims, 31 Drawing Sheets

(56) References Cited

U.S. PATENT DOCUMENTS

| | | |
|---|---|---|
| 11,322,446 B2* | 5/2022 | Kim .................. H01L 25/18 |
| 2017/0207197 A1* | 7/2017 | Yu ..................... H01L 24/92 |
| 2021/0111153 A1 | 4/2021 | Lin et al. |
| 2021/0242117 A1 | 8/2021 | Hung et al. |
| 2022/0285328 A1* | 9/2022 | Kim ................ H01L 23/3128 |
| 2023/0065366 A1* | 3/2023 | Kim ................ H01L 23/3135 |

* cited by examiner

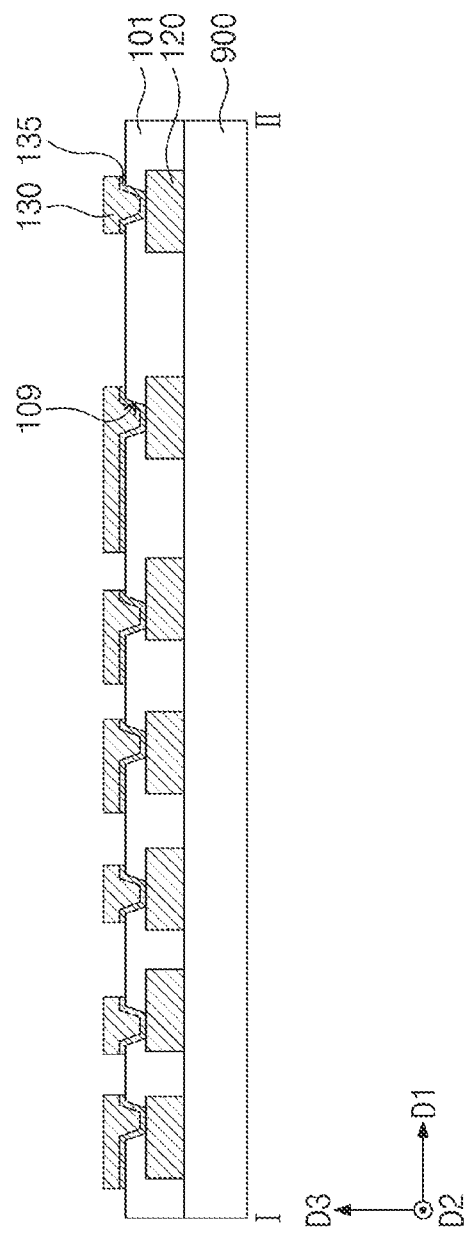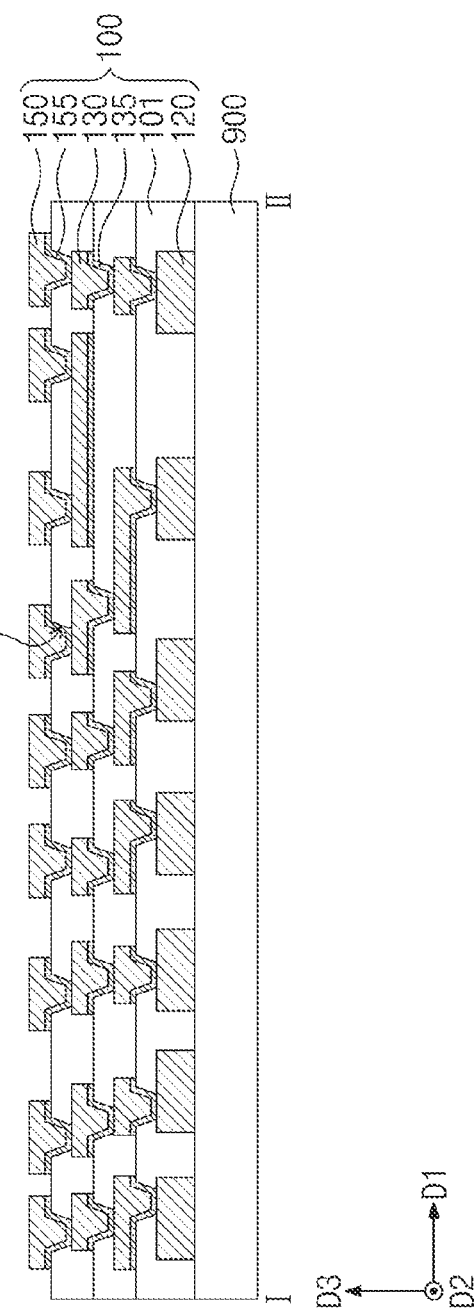

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0111542 filed on Aug. 24, 2021, in the Korean Intellectual Property Office, the disclosure of which is hereby incorporated by reference in its entirety.

BACKGROUND

The present disclosure relates to a semiconductor package and, more particularly, to a semiconductor package including a redistribution substrate.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of the electronic industry, various research has been conducted to improve reliability and durability of semiconductor packages.

SUMMARY

Some embodiments of the present disclosure provide a semiconductor package with improved electrical and thermal properties.

According to some embodiments of the present disclosure, a semiconductor package may include: a first redistribution substrate; a lower semiconductor chip on the first redistribution substrate, the lower semiconductor chip including a through via therein; a first lower conductive structure and a second lower conductive structure that are on the first redistribution substrate and are laterally spaced apart from the lower semiconductor chip; an upper semiconductor chip on the lower semiconductor chip and the second lower conductive structure, the upper semiconductor chip being coupled to the through via and the second lower conductive structure; and an upper conductive structure on the first lower conductive structure. A width of the second lower conductive structure may be greater than a width of the through via.

According to some embodiments of the present disclosure, a semiconductor package may include: a first redistribution substrate; a lower semiconductor chip on the first redistribution substrate, the lower semiconductor chip including a through via therein; a first lower conductive structure disposed on the first redistribution substrate and laterally spaced apart from the lower semiconductor chip; a second lower conductive structure disposed on the first redistribution substrate and laterally spaced apart from the lower semiconductor chip and the first lower conductive structure; an upper conductive structure on the first lower conductive structure; and an upper semiconductor chip on a top surface of the lower semiconductor chip and a top surface of the second lower conductive structure. The upper semiconductor chip may be coupled to the through via and the second lower conductive structure.

According to some embodiments of the present disclosure, a semiconductor package may include: a first redistribution substrate that includes a first dielectric layer, a first seed pattern, and a first conductive pattern on the first seed pattern, the first dielectric layer including a photo-imagable polymer; a solder ball on a bottom surface of the first redistribution substrate; a lower semiconductor chip on a top surface of the first redistribution substrate, the lower semiconductor chip including a lower pad, a through via, and an upper pad; a plurality of lower conductive structures disposed on the first redistribution substrate and laterally spaced apart from the lower semiconductor chip, the lower conductive structures including a first lower conductive structure and a second lower conductive structure that are spaced apart from each other; an upper conductive structure on the first lower conductive structure; an upper semiconductor chip on a top surface of the lower semiconductor chip and a top surface of the second lower conductive structure, the upper semiconductor chip being laterally spaced apart from the upper conductive structure; a plurality of first solder bumps between the lower semiconductor chip and the upper semiconductor chip, the first solder bumps being coupled to the upper pad and the upper semiconductor chip; a second solder bump between the second lower conductive structure and the upper semiconductor chip, the second solder bump being coupled to the second lower conductive structure and the upper semiconductor chip; and a lower molding layer on the first redistribution substrate, the lower molding layer covering a sidewall of the lower semiconductor chip and sidewalls of the lower conductive structures. The lower pad may be on bottom surface of the lower semiconductor chip. The through via may be in the lower semiconductor chip and may be coupled to the lower pad. The upper pad may be on the top surface of the lower semiconductor chip and coupled to the through via.

BRIEF DESCRIPTION OF THE DRAWINGS

FIGS. 8A to 8M illustrate cross-sectional views showing a method of fabricating a semiconductor package according to some embodiments.

DETAILED DESCRIPTION OF EMBODIMENTS

Figure 1A:
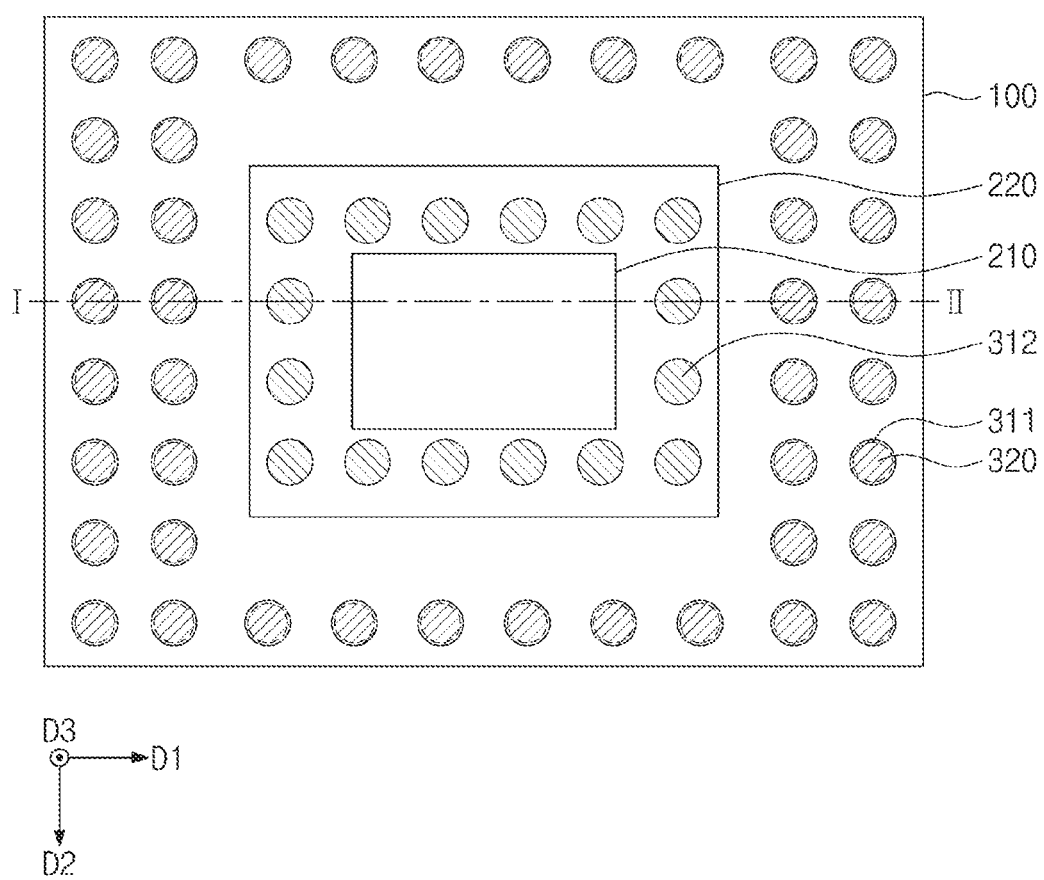
FIG. 1A illustrates a plan view showing a semiconductor package according to some embodiments.

In this description, like reference numerals may indicate like components. The following will now describe a semiconductor package and its fabrication method according to the present disclosure.

Figure 1B:
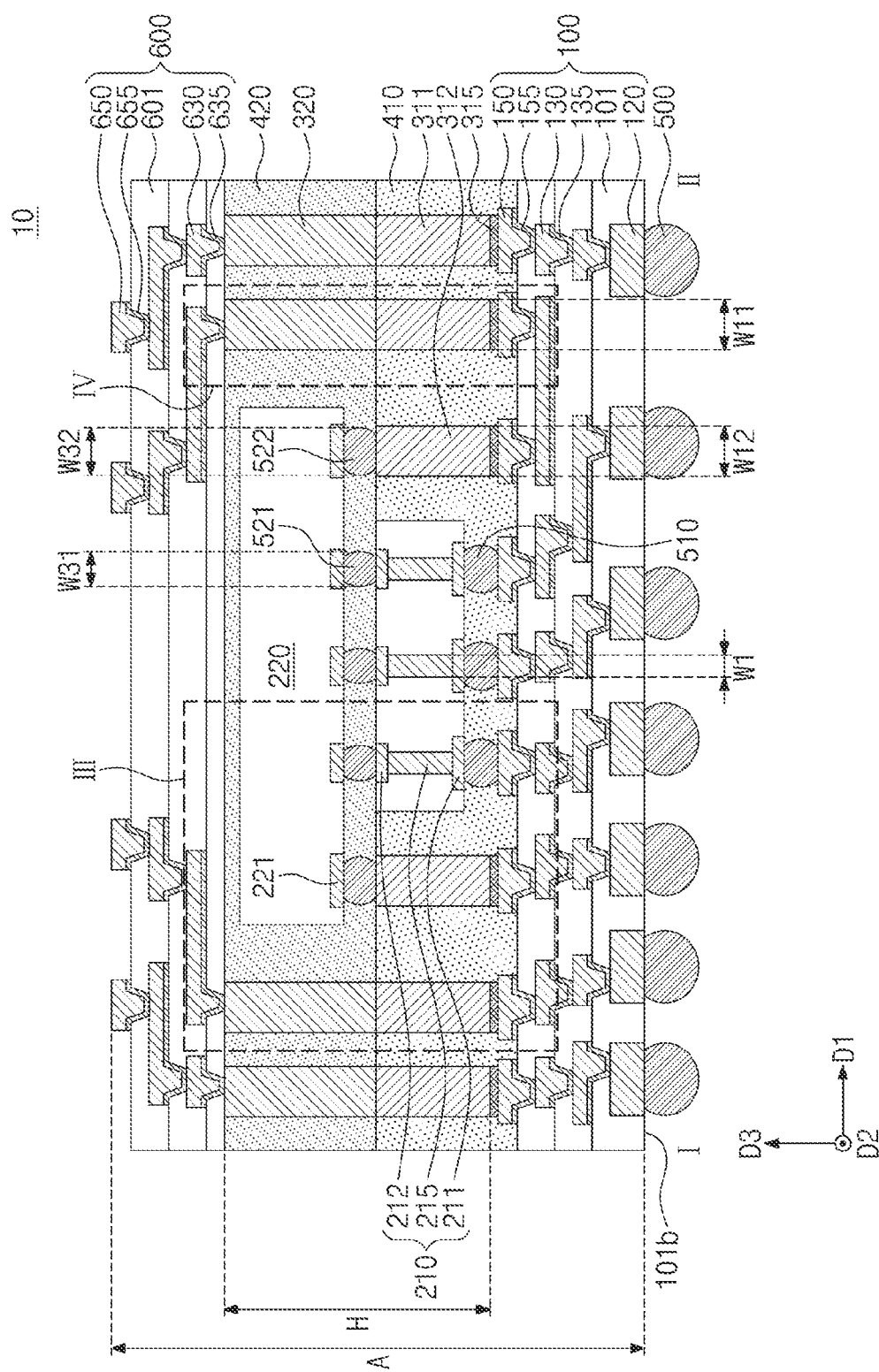
FIG. 1B illustrates a cross-sectional view taken along line I-II of FIG. 1A.
Figure 1C:
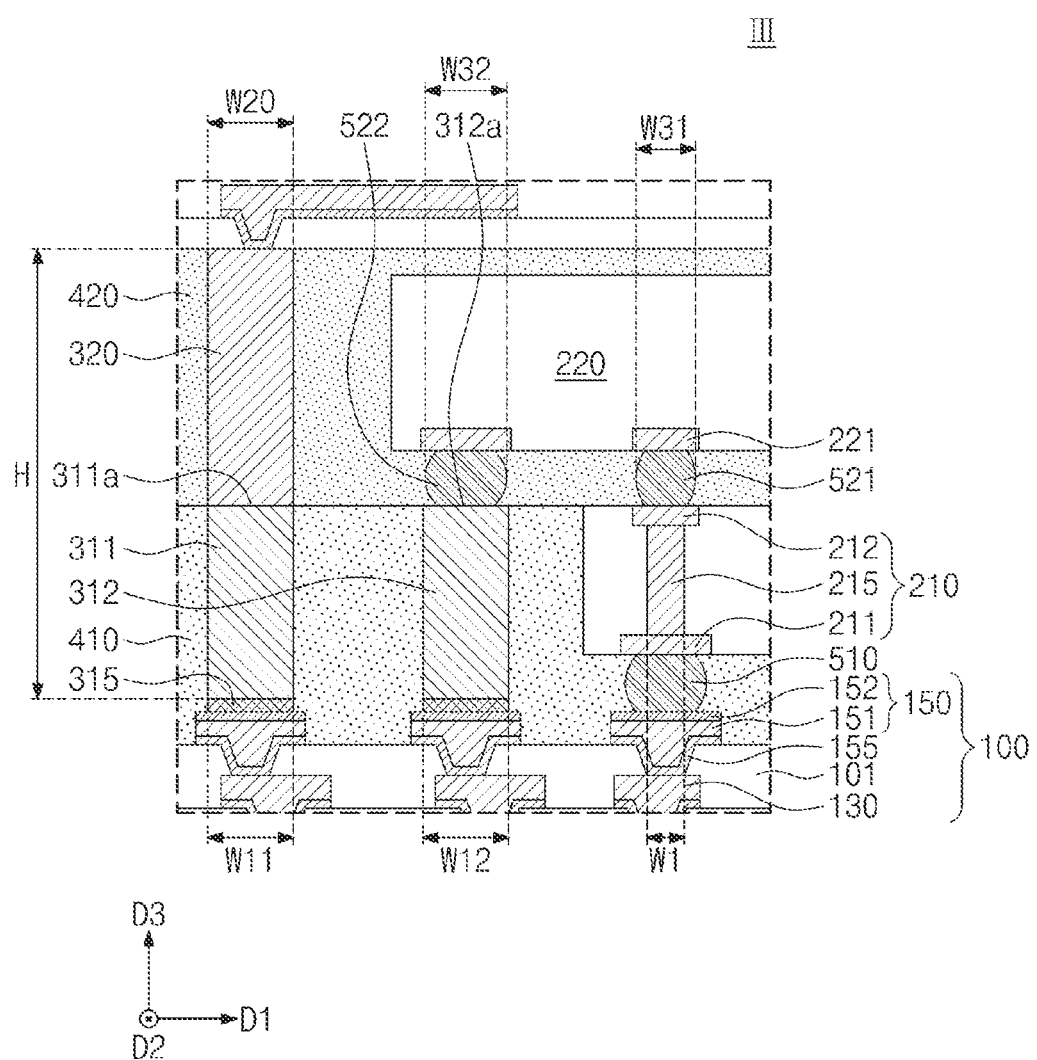
FIG. 1C illustrates an enlarged view showing section III of FIG. 1B.
Figure 1D:
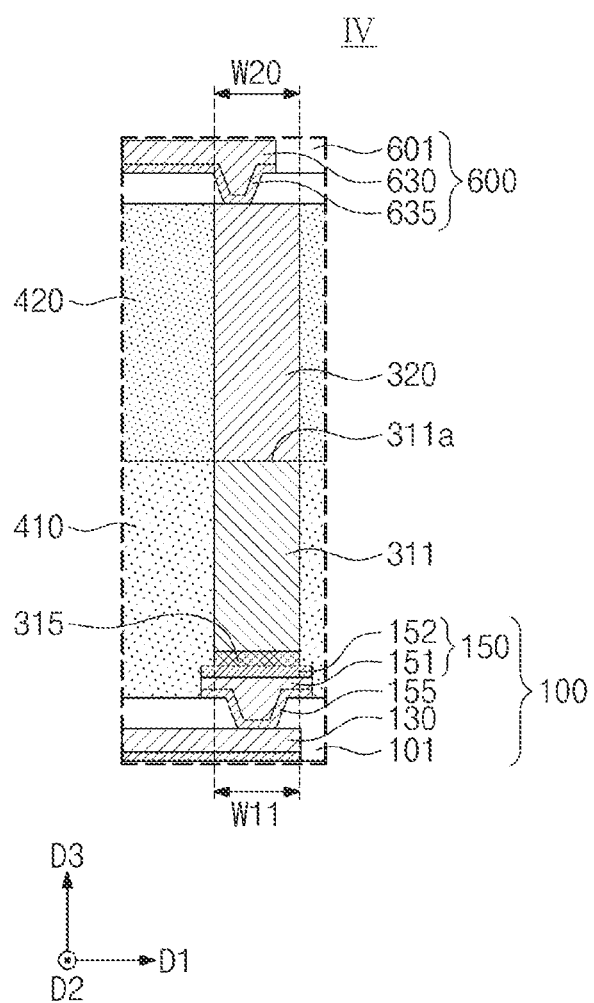
FIG. 1D illustrates an enlarged view showing section IV of FIG. 1B.

FIG. 1A illustrates a plan view showing a semiconductor package according to some embodiments. FIG. 1B illustrates a cross-sectional view taken along line I-II of FIG. 1A. FIG. 1C illustrates an enlarged view showing section III of FIG. 1B. FIG. 1D illustrates an enlarged view showing section IV of FIG. 1B.

Referring to FIGS. 1A to 1D, a semiconductor package 10 may include a first redistribution substrate 100, solder balls 500, a lower semiconductor chip 210, an upper semiconductor chip 220, a first lower conductive structure 311, a second lower conductive structure 312, an upper conductive structure 320, first solder bumps 521, second solder bumps 522, a lower molding layer 410, an upper molding layer 420, and a second redistribution substrate 600. The semiconductor package 10 may be a lower package.

The first redistribution substrate 100 may include a first dielectric layer 101, under-bump patterns 120, first redistribution patterns 130, first seed patterns 135, first seed pads 155, and first redistribution pads 150. The first dielectric layer 101 may include an organic material, such as a photo-imageable dielectric (PID). The photo-imageable dielectric may be a polymer. The photo-imageable dielectric may include, for example, at least one selected from photosensitive polyimide, polybenzoxazole, phenolic polymers, and benzocyclobutene polymers. The first dielectric layer 101 may be provided in plural. The number of stacked first dielectric layers 101 may be variously changed. For example, the plurality of first dielectric layers 101 may include the same material as each other. An indistinct interface may be provided between neighboring first dielectric layers 101.

A first direction D1 may be parallel to a bottom surface 101b of a lowermost one of the first dielectric layers 101. A second direction D2 may be parallel to the bottom surface 101b of the lowermost first dielectric layer 101 and may be substantially orthogonal to the first direction D1. A third direction D3 may be substantially perpendicular to the first direction D1 and the second direction D2.

The under-bump patterns 120 may be provided in the lowermost first dielectric layer 101. The under-bump patterns 120 may have their bottom surfaces that are not covered with the lowermost first dielectric layer 101. The under-bump patterns 120 may serve as pads for the solder balls 500. The under-bump patterns 120 may be laterally spaced apart and electrically insulated from each other. The phrase "two components are laterally spaced apart from each other" may mean "two components are horizontally spaced apart from each other." The term "horizontal" may indicate the meaning of "parallel to a bottom surface of the first redistribution substrate 100 or to the first direction D1." The bottom surface of the first redistribution substrate 100 may be that of the lowermost first dielectric layer 101. The bottom surface of the first redistribution substrate 100 may include the bottom surface 101b of the lowermost first dielectric layer 101 and the bottom surfaces of the under-bump patterns 120. The under-bump patterns 120 may include a metallic material, such as copper.

The first redistribution patterns 130 may be provided on and electrically connected to the under-bump patterns 120. The first redistribution patterns 130 may be laterally spaced apart and electrically separated from each other. The first redistribution patterns 130 may include metal, such as copper. The phrase "electrically connected to the first redistribution substrate 100" may include the meaning of "electrically connected to one of the first redistribution patterns 130."

Each of the first redistribution patterns 130 may include a first via part and a first wire part. The first via part may be provided in a corresponding first dielectric layer 101. The first wire part may be provided on the first via part, and the first wire part and the first via part may be connected to each other without an interface therebetween. A width of the first wire part may be greater than that of the first via part. The first wire part may extend onto a top surface of a corresponding first dielectric layer 101. In this description, the language "via" may be an element for vertical connection, and the language "wire" may be an element for horizontal connection. The term "vertical" may indicate the meaning of "parallel to the third direction D3."

The first redistribution patterns 130 may include a lower redistribution pattern and an upper redistribution pattern that are stacked. The lower redistribution pattern may be disposed on a corresponding under-bump pattern 120. The upper redistribution pattern may be disposed on and coupled to the lower redistribution pattern.

The first seed patterns 135 may be correspondingly disposed on bottom surfaces of the first redistribution patterns 130. For example, each of the first seed patterns 135 may cover a bottom surface of the first wire part included in a corresponding first redistribution pattern 130 and may also cover a bottom surface and a sidewall of the first via part included in the corresponding first redistribution pattern 130. Each of the first seed patterns 135 may not extend onto a sidewall of the first wire part included in the corresponding first redistribution pattern 130. The first seed patterns 135 may include a material different from that of the under-bump patterns 120 and that of the first redistribution patterns 130. For example, the first seed patterns 135 may include a conductive seed material. The conductive seed material may include one or more of copper, titanium, and any alloy thereof. The first seed patterns 135 may serve as barrier layers to prevent diffusion of materials included in the first redistribution patterns 130.

The first redistribution pads 150 may be laterally spaced apart from each other. The first redistribution pads 150 may be disposed on and coupled to the first redistribution patterns 130. Each of the first redistribution pads 150 may be coupled to a corresponding under-bump pattern 120 through the lower redistribution pattern and the upper redistribution pattern. As the first redistribution patterns 130 are provided, at least one first redistribution pad 150 may not be vertically aligned with the under-bump pattern 120 electrically connected to the at least one first redistribution pad 150. Accordingly, it may be possible to more freely design an arrangement of the first redistribution pads 150. The number of the first redistribution patterns 130 stacked between the under-bump patterns 120 and the first redistribution pads 150 may be variously changed without being limited to that shown in the figures.

The first redistribution pads 150 may be provided in an uppermost first dielectric layer 101 and may extend onto a top surface of the uppermost first dielectric layer 101. As shown in FIGS. 1C and 1D, each of the first redistribution pads 150 may include a body part 151 and a bonding part 152. The body part 151 may include metal, such as copper. A lower portion of the body part 151 may be disposed in the uppermost first dielectric layer 101. An upper portion of the body part 151 may extend onto the top surface of the uppermost first dielectric layer 101. The bonding part 152 may be provided on the body part 151. The bonding part 152 may have a thickness less than that of the body part 151. The bonding part 152 may include a different material from that of the body part 151. The bonding part 152 may include one or more of nickel, gold, and any alloy thereof. The bonding part 152 may serve as a protection layer or an adhesion layer. In figures other than FIGS. 1C and 1D, the body part 151 and the bonding part 152 are not illustrated in the interest of brevity, but the present disclosure is not intended to exclude the body part 151 and the bonding part 152.

The first seed pads 155 may be correspondingly provided on bottom surfaces of the first redistribution pads 150. The first seed pads 155 may be correspondingly provided between the first redistribution pads 150 and the upper redistribution patterns of the first redistribution patterns 130 and may extend between the uppermost first dielectric layer 101 and the first redistribution pads 150. The first seed pads 155 may include a material different from that of the first redistribution pads 150. The first seed pads 155 may include, for example, a conductive seed material.

As illustrated in FIG. 1B, the solder balls 500 may be disposed on the bottom surface of the first redistribution substrate 100. For example, the solder balls 500 may be correspondingly disposed on the bottom surfaces of the under-bump patterns 120, thereby coupled to corresponding under-bump patterns 120. The solder balls 500 may be electrically connected through the under-bump patterns 120 to the first redistribution patterns 130. The solder balls 500 may be electrically separated from each other. The solder balls 500 may include a solder material. The solder material may include, for example, tin, bismuth, lead, silver, or any alloy thereof. The solder balls 500 may include a signal solder ball, a ground solder ball, and a power solder ball.

The lower semiconductor chip 210 may be mounted on a top surface of the first redistribution substrate 100. When viewed in plan, the lower semiconductor chip 210 may be disposed on a central region of the first redistribution substrate 100. For example, the lower semiconductor chip 210 may be a memory chip, such as an SRAM or a DRAM.

The lower semiconductor chip 210 may include lower pads 211, through vias 215, and upper pads 212. The lower pads 211 and the upper pads 212 may be respectively provided on a bottom surface and a top surface of the lower semiconductor chip 210. The lower pads 211 and the upper pads 212 may be electrically connected to integrated circuits of the lower semiconductor chip 210. The lower pads 211 or the upper pads 212 may be chip pads. The through vias 215 may be provided in the lower semiconductor chip 210 and may be correspondingly coupled to the lower pads 211 and the upper pads 212. The through vias 215 may be electrically connected to the integrated circuits of the lower semiconductor chip 210. The phrase "a certain component is electrically connected to a semiconductor chip" may have the meaning that "a certain component is electrically connected to integrated circuits through chip pads of a semiconductor chip." The expression "two components are electrically connected to each other" may include the meaning that "two components are electrically directly connected to each other or indirectly connected to each other through other component(s)."

The semiconductor package 10 may further include lower bumps 510. The lower bumps 510 may be interposed between the first redistribution substrate 100 and the lower semiconductor chip 210. For example, the lower bumps 510 may be provided between and coupled to the first redistribution pads 150 and the lower pads 211. Therefore, the lower semiconductor chip 210 may be electrically connected through the lower bumps 510 to the first redistribution substrate 100. The lower bumps 510 may be solder balls. The lower bumps 510 may include a solder material. The lower bumps 510 may further include pillar patterns, and the pillar patterns may include metal, such as copper.

Although not shown, the semiconductor package 10 may further include an under-fill layer. The under-fill layer may be provided in a gap between the first redistribution substrate 100 and the lower semiconductor chip 210, thereby covering sidewalls of the lower bumps 510. The under-fill layer may include a dielectric polymer, such as an epoxy polymer.

The lower conductive structures 311 and 312 may be disposed on the first redistribution substrate 100. The lower conductive structures 311 and 312 may include the first lower conductive structure 311 and the second lower conductive structures 312. When viewed in plan, a plurality of first lower conductive structures 311 may be disposed on an edge region of the first redistribution substrate 100. The first redistribution substrate 100 may have the edge region and the central region. When viewed in plan, the edge region of the first redistribution substrate 100 may be provided between the central region and a sidewall of the first redistribution substrate 100. When viewed in plan, the edge region may surround the central region of the first redistribution substrate 100.

The first lower conductive structures 311 may be laterally spaced apart from the lower semiconductor chip 210. The first lower conductive structures 311 may be laterally spaced apart from each other. The first lower conductive structures 311 may be disposed on and coupled to corresponding first redistribution pads 150. Therefore, the first lower conductive structures 311 may be coupled to the first redistribution substrate 100. The first lower conductive structures 311 may be electrically connected through the first redistribution substrate 100 to the solder balls 500, the lower semiconductor chip 210, or the upper semiconductor chip 220. The first lower conductive structures 311 may be cylindrical metal posts. The first lower conductive structures 311 may include metal, such as copper or tungsten. The first lower conductive structures 311 may each have a first width W11. The first width W11 may be greater than widths W1 of the through vias 215. For example, the first width W11 may range from about 20 μm to about 200 μm. As the first width W11 is equal to or greater than about 20 μm, the first lower conductive structures 311 may be easily manufactured. As the first width W11 is equal to or less than about 200 μm, an arrangement of the lower semiconductor chip 210 and the second lower conductive structure 312 may not depend on the first lower conductive structures 311.

The upper conductive structures 320 may be correspondingly disposed on and electrically connected to the first lower conductive structures 311. For example, the upper conductive structures 320 may be correspondingly in direct contact with the first lower conductive structures 311. The upper conductive structures 320 may be metal posts. Each of the metal posts may have, for example, a cylindrical shape. The upper conductive structures 320 may include the same material as that of the first lower conductive structures 311. The upper conductive structures 320 may include, for example, copper. Each of the upper conductive structures 320 may have a grain different from that of the first lower conductive structure 311 connected thereto. For example, the grain of each of the upper conductive structures 320 may have a size different from that of the grain in the first lower conductive structure 311 connected to the upper conductive structure 320. Alternatively, the grain of each of the upper conductive structures 320 may have a shape different from that of the first lower conductive structure 311 connected to the upper conductive structure 320 or may have a crystal structure different from that of the first lower conductive structure 311 connected to the upper conductive structure 320.

Each of the upper conductive structures 320 may have a width W20 substantially the same as the first width W11 of each of the first lower conductive structures 311 on a bottom surface of the upper conductive structure 320. The upper conductive structures 320 may have their sidewalls aligned with those of the first lower conductive structures 311. The phrase "certain components are the same in terms of width, height, and level" may include an allowable tolerance possibly occurring during fabrication process.

The first redistribution substrate 100 may be provided on its top surface with the second lower conductive structure 312 electrically connected to the first redistribution substrate 100. The second lower conductive structure 312 may be laterally spaced apart from the lower semiconductor chip 210 and the first lower conductive structures 311. When viewed in plan, the second lower conductive structure 312 may be disposed between the lower semiconductor chip 210 and the first lower conductive structures 311. The second lower conductive structure 312 may be a metal post. For example, the second lower conductive structure 312 may have a cylindrical shape. The second lower conductive structure 312 may be disposed on and coupled to a corresponding one of the first redistribution pads 150.

The second lower conductive structure 312 may have a second width W12. The second width W12 may be greater than the width W1 of the through vias 215. The second width W12 may be the same as the first width W11. Differently from that shown, the second width W12 may be different from the first width W11.

The second lower conductive structure 312 may have a height substantially the same as that of the first lower conductive structure 311. For example, the second lower conductive structure 312 may have a top surface 312a located at substantially the same height/level as that of a top surface 311a of each of the first lower conductive structures 311 and that of the top surface of the lower semiconductor chip 210. A level (e.g., height) of a certain component may indicate a vertical level, and a level difference between two components may be measured in the third direction D3.

The second lower conductive structure 312 may include the same metallic material as that of the first lower conductive structures 311. The second lower conductive structure 312 may include, for example, copper. The second lower conductive structure 312 may have a grain the same as or different from that of the first lower conductive structure 311.

The semiconductor package 10 may further include conductive seed patterns 315. The conductive seed patterns 315 may be correspondingly disposed on bottom surfaces of the first and second lower conductive structures 311 and 312. For example, the conductive seed patterns 315 may be disposed between the first lower conductive structures 311 and their corresponding first redistribution pads 150 and between the second lower conductive structure 312 and its corresponding first redistribution pad 150. As illustrated in FIGS. 1C and 1D, each of the conductive seed patterns 315 may be coupled to the bonding part 152 of a corresponding first redistribution pad 150. Although not shown, the conductive seed patterns 315 may be omitted and the first and second lower conductive structures 311 and 312 may be directly coupled to the first redistribution pads 150.

The conductive seed patterns 315 may include a different material from that of the first redistribution pads 150 and that of the first and second lower conductive structures 311 and 312. For example, the conductive seed patterns 315 may include a conductive seed material.

The upper semiconductor chip 220 may be provided on the top surface of the lower semiconductor chip 210 and the top surface 312a of the second lower conductive structure 312. The upper semiconductor chip 220 may be of a different type from the lower semiconductor chip 210. For example, the upper semiconductor chip 220 may be a logic chip or a buffer chip. The upper semiconductor chip 220 may have a width greater than that of the lower semiconductor chip 210.

The upper semiconductor chip 220 may have a first part and a second part. The first part of the upper semiconductor chip 220 may be provided on the top surface of the lower semiconductor chip 210 while vertically overlapping the lower semiconductor chip 210. When viewed in plan, the first part of the upper semiconductor chip 220 may be spaced apart from the second lower conductive structure 312. The first solder bumps 521 may be provided between the lower semiconductor chip 210 and the first part of the upper semiconductor chip 220. As shown in FIG. 1C, the first solder bumps 521 may be coupled to the upper pads 212 and chip pads 221 on a bottom surface of the first part included in the upper semiconductor chip 220. The first solder bumps 521 may include a solder material. The first solder bumps 521 may further include pillar patterns (not shown), and the pillar patterns may include metal, such as copper. The upper semiconductor chip 220 may be electrically connected through the first solder bumps 521 to the through vias 215. The first solder bumps 521 may have relatively small widths W31 and pitches.

When viewed in plan, the second part of the upper semiconductor chip 220 may correspond to an edge region of the upper semiconductor chip 220. The second part may be an overhang portion of the upper semiconductor chip 220. When viewed in plan, the second part of the upper semiconductor chip 220 may overlap the second lower conductive structure 312 and may be spaced apart from the lower semiconductor chip 210. The second lower conductive structure 312 may be provided between the first redistribution substrate 100 and the second part of the upper semiconductor chip 220.

The second solder bump 522 may be disposed between the second lower conductive structure 312 and the second part of the upper semiconductor chip 220. For example, the second solder bump 522 may be coupled to the second lower conductive structure 312 and a chip pad 221 on a bottom surface of the second part included in the upper semiconductor chip 220. The upper semiconductor chip 220 may be electrically connected to a corresponding solder ball 500 through the second solder bump 522 and the second lower conductive structure 312. Alternatively, the upper semiconductor chip 220 may be electrically connected to the upper conductive structures 320 through the second lower conductive structure 312 and the first redistribution substrate 100. The second solder bumps 522 may include a solder material. The second solder bump 522 may further include a pillar pattern (not shown).

According to some embodiments, as the second lower conductive structure 312 is provided, there may be dispersion in electrical paths for the upper semiconductor chip 220. For example, the through vias 215 may serve as signal paths for the upper semiconductor chip 220 and the second lower conductive structure 312 may serve as a voltage supply path for the upper semiconductor chip 220. The voltage may be a power voltage or a ground voltage. Therefore, it may be possible to freely design an electrical path for the upper semiconductor chip 220.

According to some embodiments, the through vias 215 may be signal through vias. The upper semiconductor chip 220 may communicate data signals with the lower semiconductor chip 210 or the solder balls 500 through the through vias 215 and the first solder bumps 521. As the through vias 215 have their relatively small widths W1 and pitches, the through vias 215 may be highly integrated in the lower semiconductor chip 210. For example, signal input/output paths may become highly integrated for the upper semiconductor chip 220. The upper semiconductor chip 220 may improve in electrical properties.

According to some embodiments, the second lower conductive structure 312 may be a voltage supply conductive structure. The second solder bump 522 may be a voltage supply bump. For example, the upper semiconductor chip 220 may be supplied with voltage through the second solder bump 522 and the second lower conductive structure 312. The voltage may be a power voltage or a ground voltage. The second lower conductive structure 312 may have a diameter greater than those of the through vias 215. The second width W12 of the second lower conductive structure 312 may be greater than the widths W1 of the through vias 215. Therefore, the second lower conductive structure 312 may decrease in resistance. A greater amount of current may be supplied through the second lower conductive structure 312 to the upper semiconductor chip 220. Accordingly, the semiconductor package 10 may increase in electrical properties.

As the second lower conductive structure 312 is provided, a voltage supply via may be omitted in the lower semiconductor chip 210 or the number of voltage supply vias may be reduced in the lower semiconductor chip 210. Accordingly, there may be a limitation in arrangement of the through vias 215 in the lower semiconductor chip 210 or a limitation in size of the lower semiconductor chip 210.

The second width W12 of the second lower conductive structure 312 may range from about 20 μm to about 200 μm. When the second width W12 is less than about 20 μm, the second lower conductive structure 312 may increase in resistance. When the second width W12 is greater than about 200 μm, the second lower conductive structure 312 may impose limitations on an arrangement of the lower semiconductor chip 210 and the first lower conductive structures 311. According to some embodiments, the second width W12 may range from about 20 μm to about 200 μm. Therefore, the second lower conductive structure 312 may have small resistance. The upper semiconductor chip 220 may be favorably supplied with voltage through the second lower conductive structure 312. In addition, there may be a reduction in an arrangement of the lower semiconductor chip 210 and the first lower conductive structures 311.

The second solder bump 522 may have a width W32 greater than the widths W31 of the first solder bumps 521. The chip pad 221, which is coupled to the second solder bump 522, of the upper semiconductor chip 220 may have a width greater than those of the chip pads 221, which are coupled to the first solder bumps 521, of the upper semiconductor chip 220.

The second lower conductive structure 312 may be provided in plural. The plurality of second lower conductive structures 312 may be positioned on opposite sides of the lower semiconductor chips 210. For example, as shown in FIG. 1A, the second lower conductive structures 312 may be provided while surrounding the lower semiconductor chip 210. The plurality of second lower conductive structures 312 may serve as power conductive structures.

Differently from that discussed above, at least one of the second lower conductive structures 312 may serve as a ground conducive structure or a signal conductive structure. At least one of the through vias 215 may serve as a power through via or a ground through via.

The lower molding layer 410 may be provided on the first redistribution substrate 100. The lower molding layer 410 may cover a sidewall of the lower semiconductor chip 210 and sidewalls of the first and second lower conductive structures 311 and 312. As shown in FIG. 1C, the lower molding layer 410 may have a top surface coplanar with the top surface 311a of the first lower conductive structure 311, the top surface 312a of the second lower conductive structure 312, and the top surface of the lower semiconductor chip 210. The lower molding layer 410 may include a dielectric polymer, such as an epoxy-based molding compound. The lower molding layer 410 may further extend into a gap between the first redistribution substrate 100 and the lower semiconductor chip 210, thereby encapsulating the lower bumps 510. The lower semiconductor chip 210 may include a first dielectric polymer, such as an epoxy-based molding compound. The lower molding layer 410 may further include first fillers. The first fillers may be provided in the first dielectric polymer. The first fillers may include an inorganic material, such as silica.

The lower molding layer 410 may be provided thereon with the upper molding layer 420 that covers the upper semiconductor chip 220 and the sidewalls of the upper conductive structures 320. For example, the upper molding layer 420 may cover a sidewall and a top surface of the upper semiconductor chip 220. The upper molding layer 420 may have a top surface coplanar with those of the upper conductive structures 320. The upper molding layer 420 may further extend onto a bottom surface of the upper semiconductor chip 220, thereby encapsulating the first solder bumps 521 and the second solder bump 522. Alternatively, an upper under-fill layer may be interposed between the lower semiconductor chip 210 and the upper semiconductor chip 220, thereby encapsulating the first solder bumps 521. The upper under-fill layer may further encapsulate the second solder bumps 522.

The upper molding layer 420 may be in direct contact with the top surface of the lower molding layer 410. The upper molding layer 420 may include a second dielectric polymer. The second dielectric polymer may include, for example, an epoxy-based molding compound. The upper molding layer 420 may further include second fillers. For example, the second dielectric polymer may be different from the first dielectric polymer of the lower molding layer 410. Alternatively, the second dielectric polymer may be the same as the first dielectric polymer, but the second filler may be different from the first fillers. For example, the second fillers may differ from the first fillers in terms of material, shape, or content ratio. For another example, the second dielectric polymer may be the same as the first dielectric polymer, and the second filler may be the same as the first fillers.

The second redistribution substrate 600 may be disposed on the upper molding layer 420 and the upper conductive structures 320. The second redistribution substrate 600 may be disposed on the upper semiconductor chip 220 and may be vertically spaced apart from the top surface of the upper semiconductor chip 220. Alternatively, the upper molding layer 420 may expose the top surface of the upper semiconductor chip 220 and the second redistribution substrate 600 may contact the exposed top surface of the upper semiconductor chip 220. The second redistribution substrate 600 may be electrically connected to the upper conductive structures 320.

The second redistribution substrate 600 may include a second dielectric layer 601, the second redistribution patterns 630, second seed patterns 635, and second redistribution pads 650. The second dielectric layer 601 may include a plurality of second dielectric layers. The plurality of second dielectric layers 601 may be stacked on the upper molding layer 420. The second dielectric layers 601 may include a photo-imageable dielectric (PID). For example, the second dielectric layers 601 may include the same material as each other. An indistinct interface may be provided between neighboring second dielectric layers 601. The number of the second dielectric layers 601 may be variously changed.

The second redistribution patterns 630 may be provided on the upper conductive structures 320. Each of the second redistribution patterns 630 may include a second via part and a second wire part. The second via part may be provided in a corresponding second dielectric layer 601. The second wire part may be provided on the second via part, and the second wire part and the second via part may be connected to each other without an interface therebetween. The second wire part of each second redistribution pattern 630 may have a width greater than that at a top surface of the second via part of each second redistribution pattern 630. The second wire part of each of the second redistribution patterns 630 may extend onto a top surface of a corresponding second dielectric layer 601. The second redistribution patterns 630 may include metal, such as copper.

The second redistribution patterns 630 may include a second lower redistribution pattern and a second upper redistribution pattern that are stacked. The second lower redistribution pattern may be disposed on and coupled to a corresponding upper conductive structure 320. For example, the second via part of the second lower redistribution pattern may be provided on the top surface of the upper conductive structure 320. The second upper redistribution pattern may be disposed on and coupled to the second lower redistribution pattern.

The second seed patterns 635 may be correspondingly disposed on bottom surfaces of the second redistribution patterns 630. For example, each of the second seed patterns 635 may be provided on a bottom surface and a sidewall of the second via part of a corresponding second redistribution pattern 630 and may extend onto a bottom surface of the second wire part of the corresponding second redistribution pattern 630. Each of the second seed patterns 635 may include a different material from those of the upper conductive structures 320 and those of the second redistribution patterns 630. For example, the second seed patterns 635 may include a conductive seed material. The second seed patterns 635 may serve as barrier layers to prevent diffusion of materials included in the second redistribution patterns 630.

Each of the second redistribution pads 650 may be disposed on and coupled to a corresponding second redistribution pattern 630. For example, each of the second redistribution pads 650 may be disposed on the second upper redistribution pattern. The second redistribution pads 650 may be laterally spaced apart from each other. The second redistribution pads 650 may have their lower portions that are provided in an uppermost second dielectric layer 601. The second redistribution pads 650 may have their upper portions that extend onto a top surface of the uppermost second dielectric layer 601. The second redistribution pads 650 may include metal, such as copper.

The second redistribution pads 650 may be coupled through the second redistribution patterns 630 to corresponding upper conductive structures 320. As the second redistribution patterns 630 are provided, at least one second redistribution pad 650 may not be vertically aligned with the upper conductive structure 320 electrically connected to the second redistribution pad 650. Accordingly, it may be possible to more freely design an arrangement of the second redistribution pads 650. There may be a large variation without limitation in the number of the second redistribution patterns 630 that are stacked between one upper conductive structure 320 and its corresponding second redistribution pad 650. For example, one or three or more second redistribution patterns 630 may be provided between the upper conductive structure 320 and its corresponding second redistribution pad 650.

The second redistribution substrate 600 may further include second seed pads 655. The second seed pads 655 may be correspondingly interposed between uppermost second redistribution patterns 630 and the second redistribution pads 650. The second seed pads 655 may include a conductive seed material.

When a one-piece (or single-layered) conductive structure is provided between the first and second redistribution substrates 100 and 600, a limitation in aspect ratio may restrict a height of the one-piece (or single-layered) conductive structure. According to some embodiments, as there is provided the first lower conductive structure 311 and the upper conductive structure 320, there may be a relatively large sum H of thicknesses of the first lower conductive structure 311 and the upper conductive structure 320. For example, a range of about 150 μm to about 950 μm may be given as the sum H of thicknesses of the first lower conductive structure 311 and the upper conductive structure 320. Because the sum H of thicknesses of the first lower conductive structure 311 and the upper conductive structure 320 is equal to or less than about 950 μm, the semiconductor package 10 may become small in size.

Because the sum H of thicknesses of the first lower conductive structure 311 and the upper conductive structure 320 is equal to or greater than about 150 μm, the top surface of the upper conductive structure 320 may be located at a relatively high level. There may thus be a reduction in limitation imposed on an interval between the first and second redistribution substrates 100 and 600. Even when the lower semiconductor chip 210 or the upper semiconductor chip 220 has a relatively large thickness, the lower semiconductor chip 210 and the upper semiconductor chip 220 may be stacked on the first redistribution substrate 100. According to some embodiments, a semiconductor substrate of the upper semiconductor chip 220 may have a relatively large thickness. The semiconductor substrate of the upper semiconductor chip 220 may have high thermal conductivity, and thus the semiconductor package 10 may improve in thermal radiation properties. The semiconductor substrate of the upper semiconductor chip 220 may have relatively large strength, and thus the semiconductor package 10 may improve in mechanical properties. The semiconductor substrate of the upper semiconductor chip 220 may have a coefficient of thermal expansion (CTE) less than that of the lower molding layer 410 and that of the upper molding layer 420, and thus the semiconductor package 10 may be prevented from warpage.

According to some embodiments, a range of about 200 μm to about 1,000 μm may be given as an interval A between the bottom surface of the first redistribution substrate 100 and a top surface of the second redistribution substrate 600. Because the interval A between the bottom surface of the first redistribution substrate 100 and the top surface of the second redistribution substrate 600 is equal to or greater than about 200 μm, the semiconductor package 10 may improve in thermal properties. Because the interval A between the bottom surface of the first redistribution substrate 100 and the top surface of the second redistribution substrate 600 is equal to or less than about 1,000 μm, the semiconductor package 10 may become compact-sized.

The following will discuss a first lower conductive structure and an upper conducive structure according to some embodiments. With reference to FIGS. 2A to 2G, a single first lower conductive structure and a single upper conductive structure will be discussed in the interest of brevity. A repetitive description is discussed.

Figure 2A:
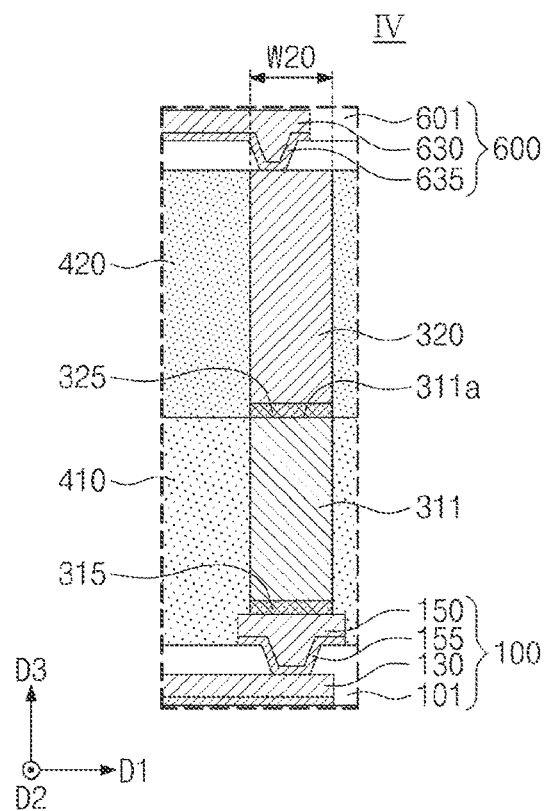
FIGS. 2A to 2G illustrate cross-sectional views showing a first lower conductive structure and an upper conductive structure according to some embodiments.

FIG. 2A illustrates an enlarged cross-sectional view of section IV depicted in FIG. 1B, showing a first lower conductive structure and an upper conductive structure according to some embodiments.

Referring to FIG. 2A, the upper conductive structure 320 may be disposed on the first lower conductive structure 311. An upper seed pattern 325 may further be interposed between the first lower conductive structure 311 and the upper conductive structure 320. The upper conductive structure 320 may be formed by an electroplating process in which the upper seed pattern 325 is used as an electrode. The upper seed pattern 325 may have a width substantially the same as the width W20 of the upper conductive structure 320. The upper seed pattern 325 may include a different material from that of the first lower conductive structure 311 and that of the upper conductive structure 320. For example, the upper seed pattern 325 may include a conductive seed material.

Figure 2B:
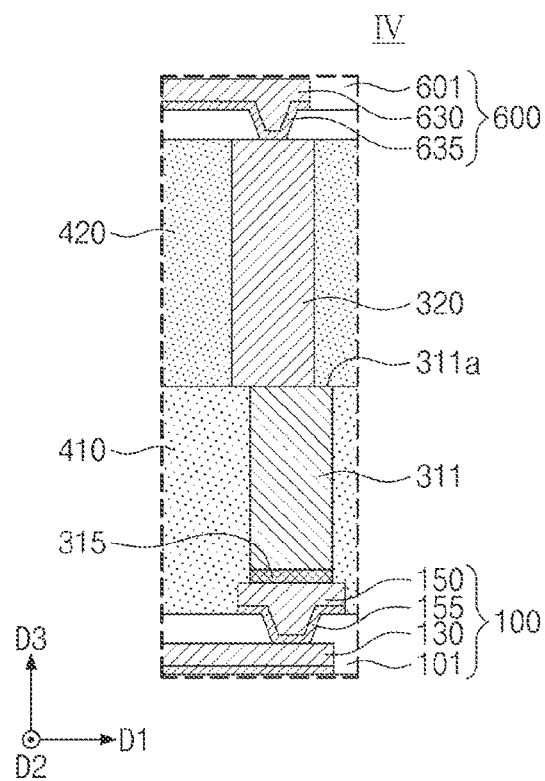
Figure 2C:
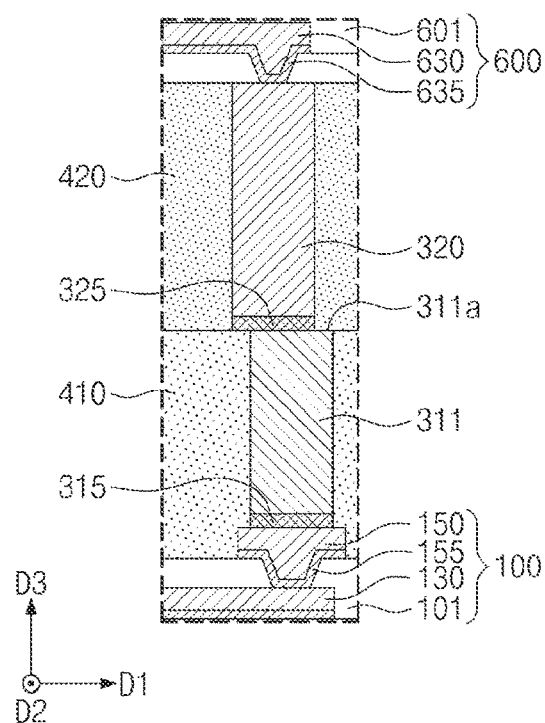

FIG. 2B illustrates an enlarged cross-sectional view of section IV depicted in FIG. 1B, showing a first lower conductive structure and an upper conductive structure according to some embodiments. FIG. 2C illustrates an enlarged cross-sectional view of section IV depicted in FIG. 1B, showing a first lower conductive structure and an upper conductive structure according to some embodiments.

Referring to FIGS. 2B and 2C, the upper conductive structure 320 may be disposed on the first lower conductive structure 311. Each of the first lower conductive structure 311 and the upper conductive structure 320 may be the same as or similar to those discussed in the embodiments of FIGS. 1B to 1D. In contrast, the upper conductive structure 320 may be shifted from the first lower conductive structure 311 in the first direction D1 or in a direction reverse to the first direction D1. The sidewall of the upper conductive structure 320 may not be aligned with the sidewall of the first lower conductive structure 311. The top surface 311a of the first lower conductive structure 311 may include a first part and a second part. The first part of the top surface 311a of the first lower conductive structure 311 may be in contact with the upper conductive structure 320, and the second part of the top surface 311a of the first lower conductive structure 311 may be in contact with the upper molding layer 420.

As shown in FIG. 2B, the upper conductive structure 320 may be in direct contact with the first lower conductive structure 311.

As shown in FIG. 2C, an upper seed pattern 325 may be disposed on the bottom surface of the upper conductive structure 320. For example, the upper seed pattern 325 may be disposed between the upper conductive structure 320 and the first lower conductive structure 311 and between the upper conductive structure 320 and the lower molding layer 410. The sidewall of the upper seed pattern 325 may be aligned with the sidewall of the upper conductive structure 320.

Figure 2D:
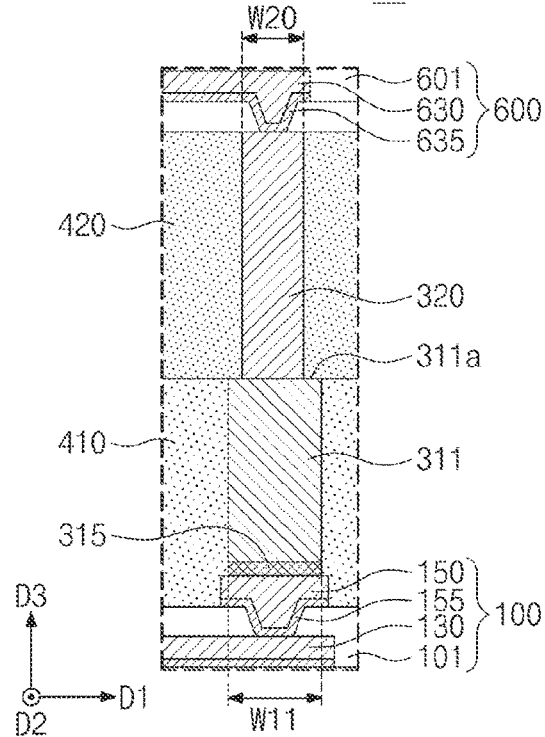
Figure 2E:
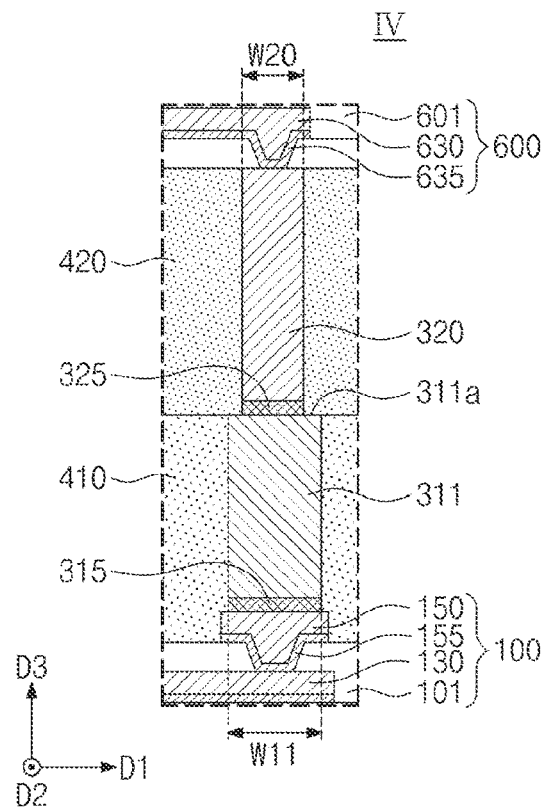

FIGS. 2D and 2E illustrate enlarged cross-sectional views of section IV depicted in FIG. 1B, showing a first lower conductive structure and an upper conductive structure according to some embodiments.

Referring to FIGS. 2D and 2E, the width W20 of the upper conductive structure 320 may be less than the first width W11 of the first lower conductive structure 311. The upper conductive structure 320 may be disposed on a central region of the top surface 311a of the first lower conductive structure 311. The top surface 311a of the first lower conductive structure 311 may have an edge region in contact with the upper molding layer 420.

As shown in FIG. 2D, the upper conductive structure 320 may be in direct contact with the first lower conductive structure 311.

As shown in FIG. 2E, the upper seed pattern 325 may be disposed between the upper conductive structure 320 and the first lower conductive structure 311. The upper seed pattern 325 may not extend between the first lower conductive structure 311 and the upper molding layer 420.

Figure 2F:
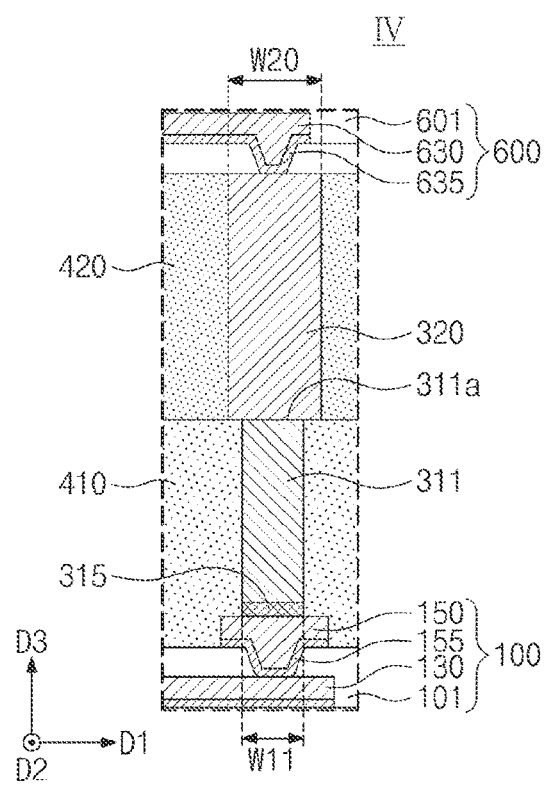
Figure 2G:
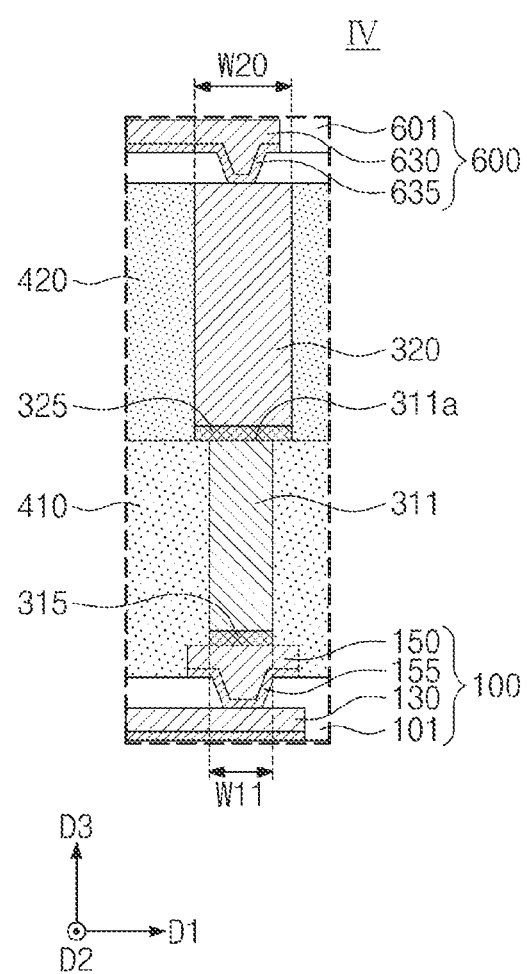

FIG. 2F illustrates an enlarged cross-sectional view of section IV depicted in FIG. 1B, showing a first lower conductive structure and an upper conductive structure according to some embodiments. FIG. 2G illustrates an enlarged cross-sectional view of section IV depicted in FIG. 1B, showing a first lower conductive structure and an upper conductive structure according to some embodiments.

Referring to FIGS. 2F and 2G, the width W20 of the upper conductive structure 320 may be greater than the first width W11 of the first lower conductive structure 311. The upper conductive structure 320 may be disposed on the top surface 311a of the first lower conductive structure 311 and the top surface of the lower molding layer 410.

As shown in FIG. 2F, the upper conductive structure 320 may be in direct contact with the first lower conductive structure 311 and the lower molding layer 410.

As shown in FIG. 2G, an upper seed pattern 325 may be disposed on the bottom surface of the first lower conductive structure 311.

Figure 3A:
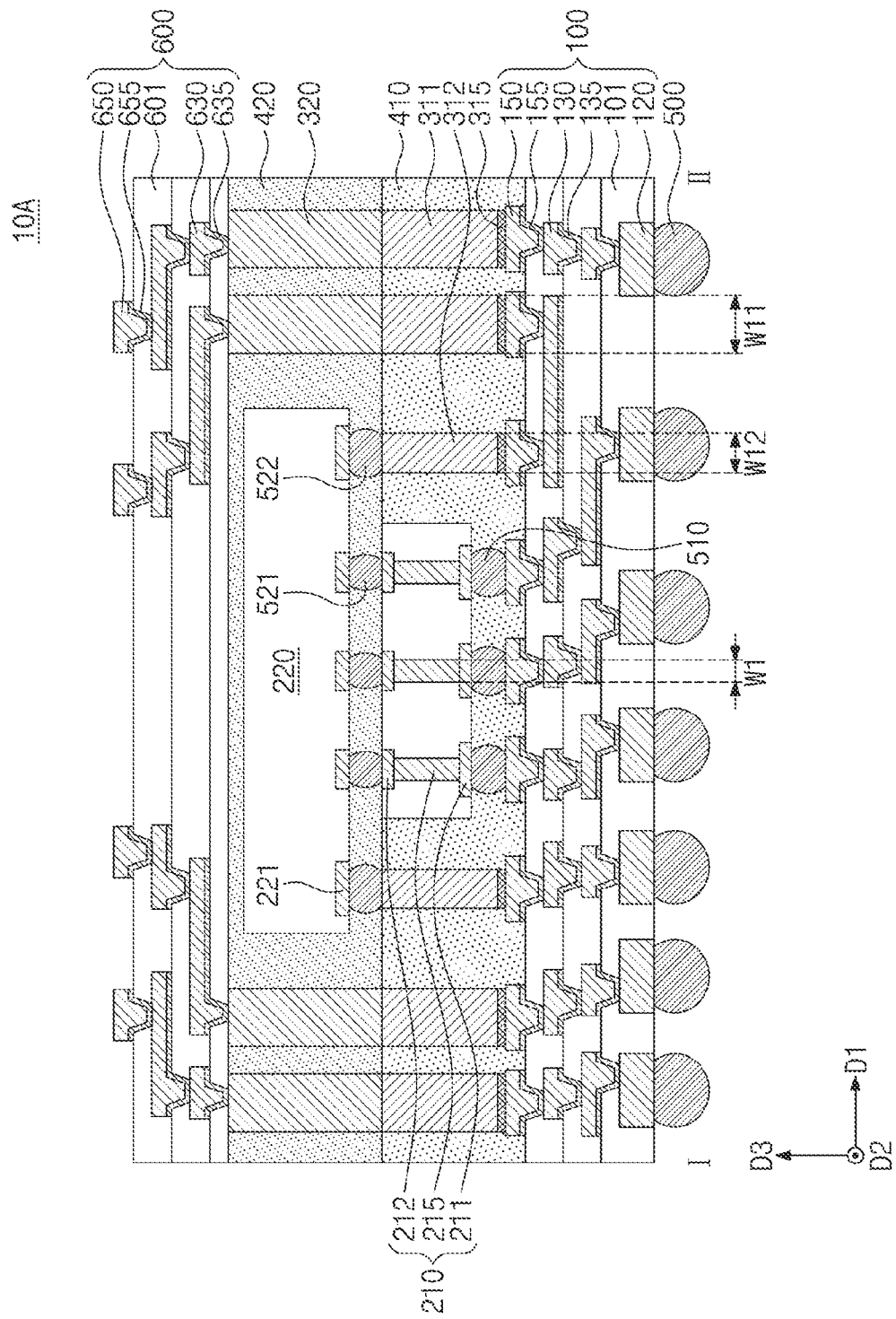
FIG. 3A illustrates a cross-sectional view showing a semiconductor package according to some embodiments.

FIG. 3A illustrates a cross-sectional view taken along line I-II of FIG. 1A, showing a semiconductor package according to some embodiments.

Referring to FIG. 3A, a semiconductor package 10A may include a first redistribution substrate 100, solder balls 500, a lower semiconductor chip 210, an upper semiconductor chip 220, a first lower conductive structure 311, a second lower conductive structure 312, an upper conductive structure 320, first solder bumps 521, second solder bumps 522, a lower molding layer 410, an upper molding layer 420, and a second redistribution substrate 600. The semiconductor package 10A may be a lower package.

A first width W11 of the first lower conductive structure 311 and a second width W12 of the second lower conductive structure 312 may be greater than widths W1 of the through vias 215. The second width W12 may be different from the first width W11. For example, the second width W12 may be less than the first width W11.

Figure 3B:
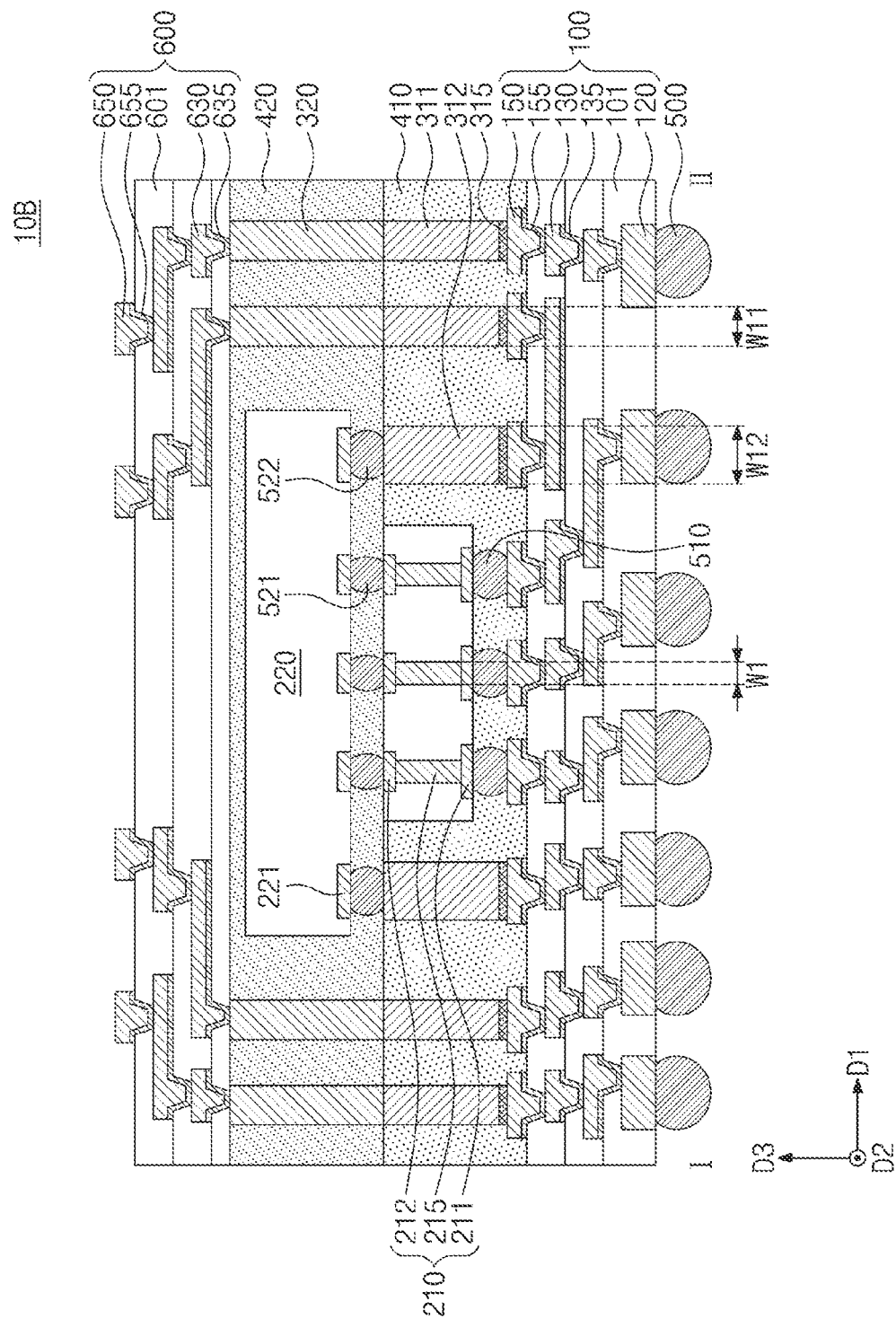
FIG. 3B illustrates a cross-sectional view showing a semiconductor package according to some embodiments.

FIG. 3B illustrates a cross-sectional view taken along line I-II of FIG. 1A, showing a semiconductor package according to some embodiments.

Referring to FIG. 3B, a semiconductor package 10B may include a first redistribution substrate 100, solder balls 500, lower and upper semiconductor chips 210 and 220, first and second solder bumps 521 and 522, lower and upper molding layers 410 and 420, first and second lower conductive structures 311 and 312, upper conductive structures 320, and a second redistribution substrate 600.

A first width W11 of the first lower conductive structure 311 and a second width W12 of the second lower conductive structure 312 may be greater than widths W1 of the through vias 215. The second width W12 may be greater than the first width W11.

Figure 4A:
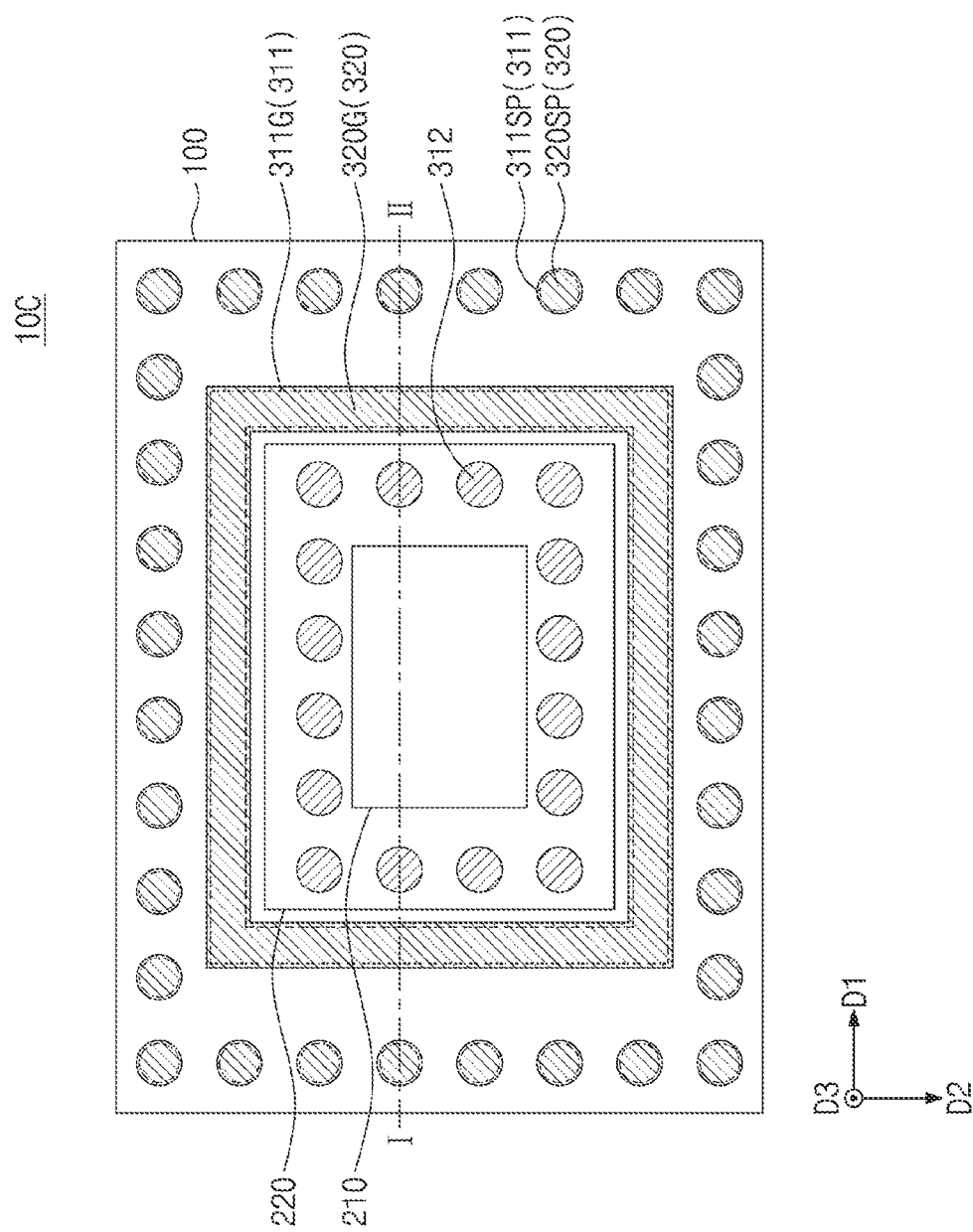
FIG. 4A illustrates a plan view showing a semiconductor package according to some embodiments.
Figure 4B:
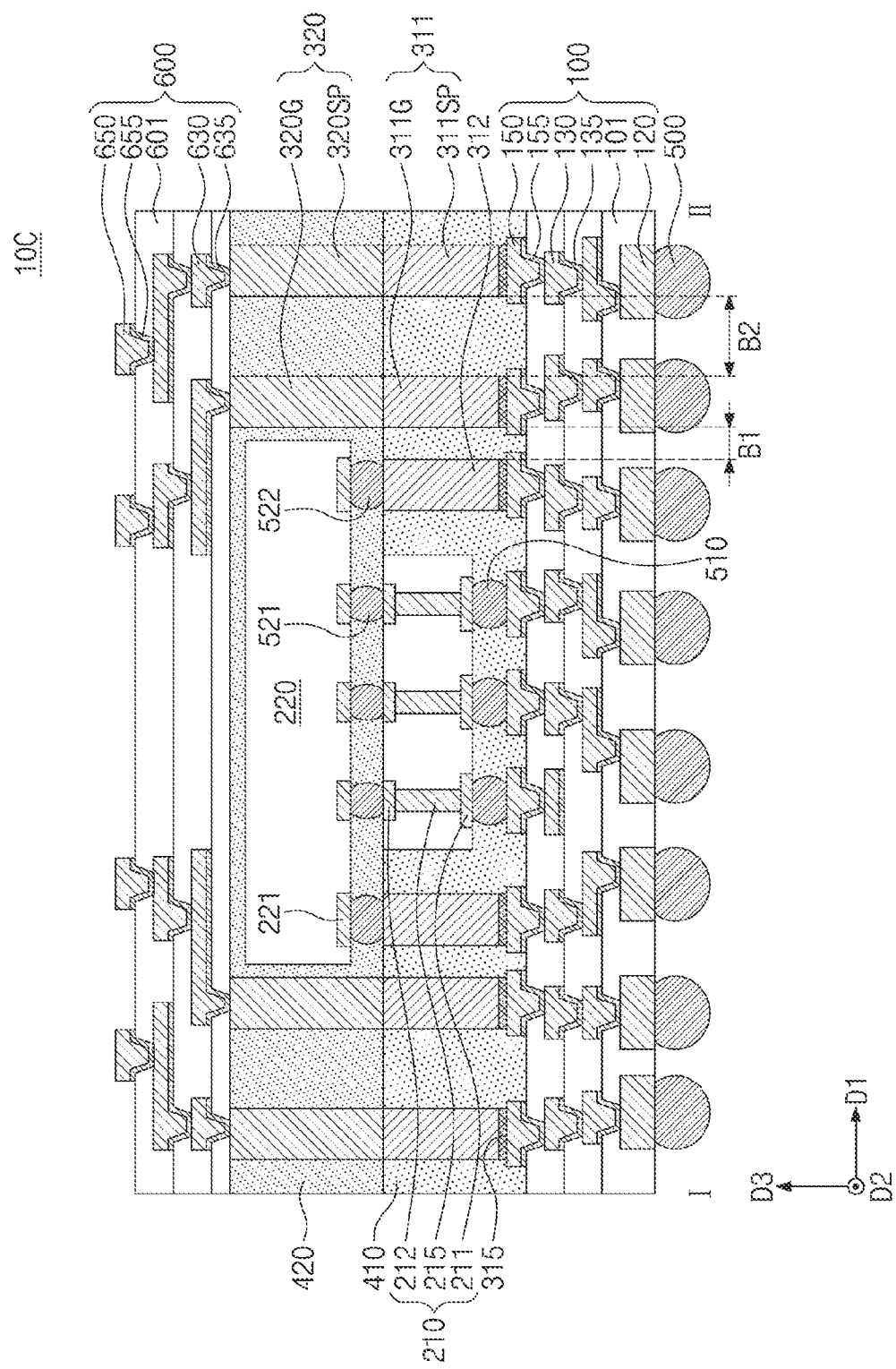
FIG. 4B illustrates a cross-sectional view taken along line I-II of FIG. 4A.

FIG. 4A illustrates a plan view showing a semiconductor package according to some embodiments. FIG. 4B illustrates a cross-sectional view taken along line I-II of FIG. 4A.

Referring to FIGS. 4A and 4B, a semiconductor package 10C may include a first redistribution substrate 100, solder balls 500, lower and upper semiconductor chips 210 and 220, first and second lower conductive structures 311 and 312, upper conductive structures 320, first and second solder bumps 521 and 522, lower and upper molding layers 410 and 420, and a second redistribution substrate 600.

The first lower conductive structures 311 may include a lower partition structure 311G and lower posts 311SP. When viewed in plan, the lower posts 311SP may be provided on an edge region of the first redistribution substrate 100. For example, when viewed in plan, the lower posts 311SP may be provided between the lower partition structure 311G and the sidewall of the first redistribution substrate 100. Each of the lower posts 311SP may have a cylindrical shape.

The lower partition structure 311G may be disposed between the second lower conductive structure 312 and the lower posts 311SP. The lower partition structure 311G may be adjacent to the second lower conductive structure 312. For example, an interval B1 between the lower partition structure 311G and the second lower conductive structure 312 may be less than a minimum interval B2 between the lower partition structure 311G and the lower posts 311SP.

As shown in FIG. 4A, when viewed in plan, the lower partition structure 311G may surround the lower semiconductor chip 210. The lower partition structure 311G may have inner lateral surfaces that are directed toward the lower semiconductor chip 210 and are spaced apart from the lower semiconductor chip 210. The lower partition structure 311G may have inner lateral surfaces having a tetragonal shape. There may be a large variation in planar shape of the inner lateral surfaces of the lower semiconductor chip 210. A planar area of the lower partition structure 311G may be greater than that of each of the lower posts 311SP.

The upper conductive structure 320 may include an upper partition structure 320G and upper posts 320SP. The upper posts 320SP may be correspondingly disposed on and coupled to the lower posts 311SP. The upper posts 320SP may each have a cylindrical shape.

The lower posts 311SP and the upper posts 320SP may be signal structures or power structures. For example, the lower posts 311SP and the upper posts 320SP may serve as data signal transfer paths between the first redistribution substrate 100 and the second redistribution substrate 600. Alternatively, at least one of the lower posts 311SP and its corresponding one of the upper posts 320SP may serve as a ground voltage supply path.

The upper partition structure 320G may be disposed on and coupled to the lower partition structure 311G. As shown in FIG. 4A, when viewed in plan, the upper partition structure 320G may surround the upper semiconductor chip 220. The upper partition structure 320G may have inner lateral surfaces that are directed toward the upper semiconductor chip 220 and are spaced apart from the upper semiconductor chip 220. A planar shape of the upper partition structure 320G may be the same as or similar to a planar shape of the lower partition structure 311G. For example, the upper partition structure 320G may have inner lateral surfaces having a tetragonal shape. A planar area of the upper partition structure 320G may be greater than that of each of the upper posts 320SP and that of each of the lower posts 311SP.

The lower partition structure 311G and the upper partition structure 320G may each be a ground structure. For example, the lower partition structure 311G and the upper partition structure 320G may be provided with ground voltage from an external device through the first redistribution substrate 100 and at least one solder ball 500. Therefore, the lower partition structure 311G and the upper partition structure 320G may shield electromagnetic interference (EMI) of the lower and upper semiconductor chips 210 and 220. The electromagnetic interference may mean that communication operations of electrical components suffer from a disturbance caused by electromagnetic waves emitted or transmitted from other electrical components. According to some embodiments, the lower partition structure 311G and the upper partition structure 320G may prevent an operation of the lower and upper semiconductor chips 210 and 220 from disturbing or being disturbed by an operation of another apparatus. The other apparatus may include one or more of an electronic device, a semiconductor device, a semiconductor package, a passive device, and an active device, but the present disclosure is not limited thereto.

Figure 5A:
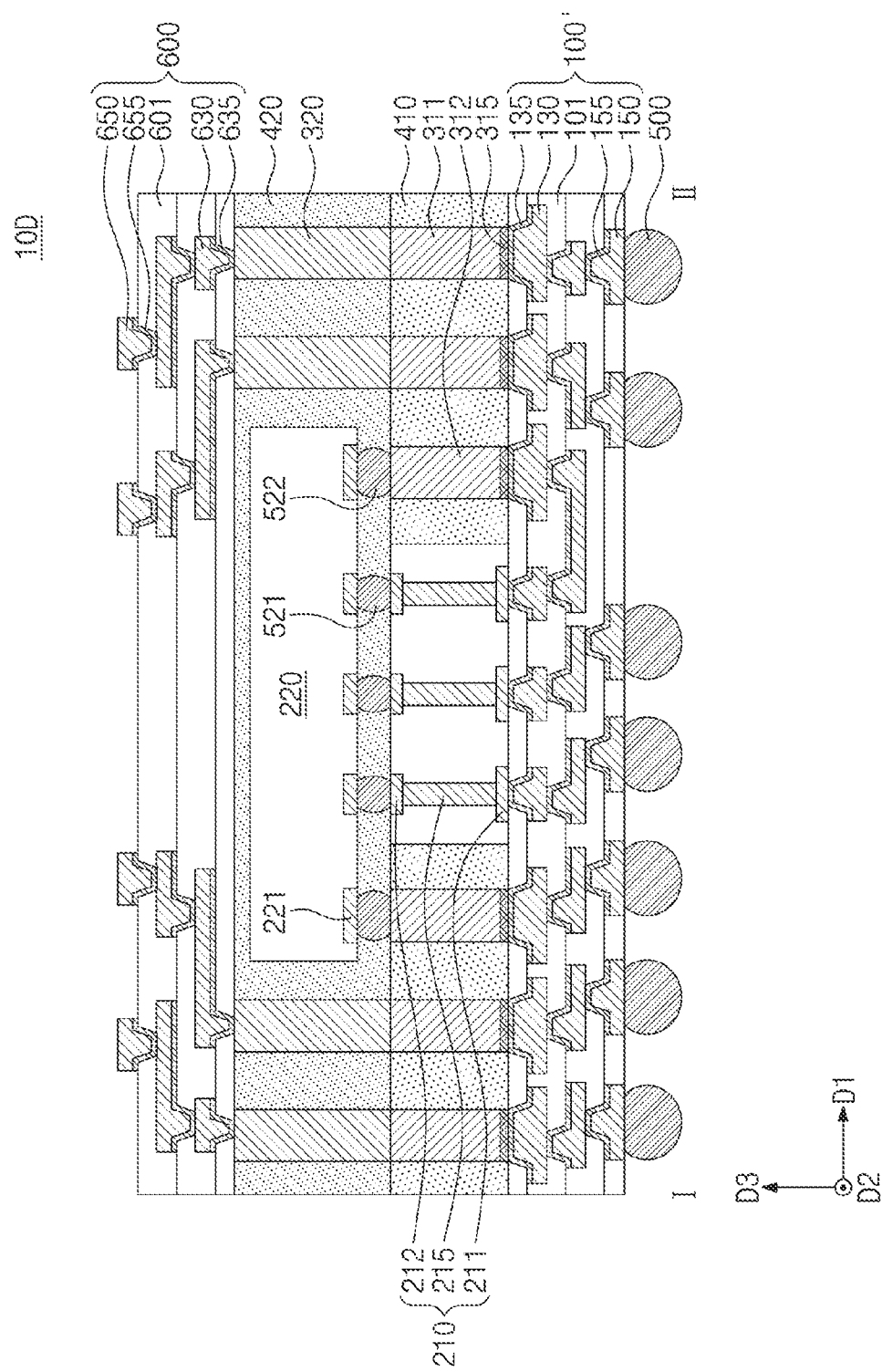
FIG. 5A illustrates a cross-sectional view showing a semiconductor package according to some embodiments.

FIG. 5A illustrates a cross-sectional view taken along line I-II of FIG. 1A, showing a semiconductor package according to some embodiments.

Referring to FIG. 5A, a semiconductor package 10D may include a first redistribution substrate 100', solder balls 500, lower and upper semiconductor chips 210 and 220, first and second lower conductive structures 311 and 312, upper conductive structures 320, first and second solder bumps 521 and 522, a lower molding layer 410, an upper molding layer 420, and a second redistribution substrate 600. In contrast, the semiconductor package 10D may not include the lower bumps 510 discussed in FIGS. 1B and 1C.

The first redistribution substrate 100' may include first dielectric layers 101, first redistribution patterns 130, first seed patterns 135, first seed pads 155, and first redistribution pads 150. The first redistribution substrate 100' may not include the under-bump patterns 120 discussed in FIG. 1B. The first redistribution substrate 100' may be in direct contact with the lower semiconductor chip 210 and the lower molding layer 410. For example, an uppermost first dielectric layer 101 may be in direct contact with a bottom surface of the lower semiconductor chip 210 and a bottom surface of the lower molding layer 410. The first seed patterns 135 may be correspondingly provided on top surfaces of the first redistribution patterns 130. The first seed patterns 135 in the uppermost first dielectric layer 101 may be coupled to the lower pads 211 or the conductive seed patterns 315. For example, the first via part of each of the uppermost first redistribution patterns 130 may vertically overlap one of the lower pad 211, the first lower conductive structure 311, and the second lower conductive structure 312.

The semiconductor package 10D may be fabricated by a chip-first scheme, but the present disclosure is not limited thereto.

Figure 5B:
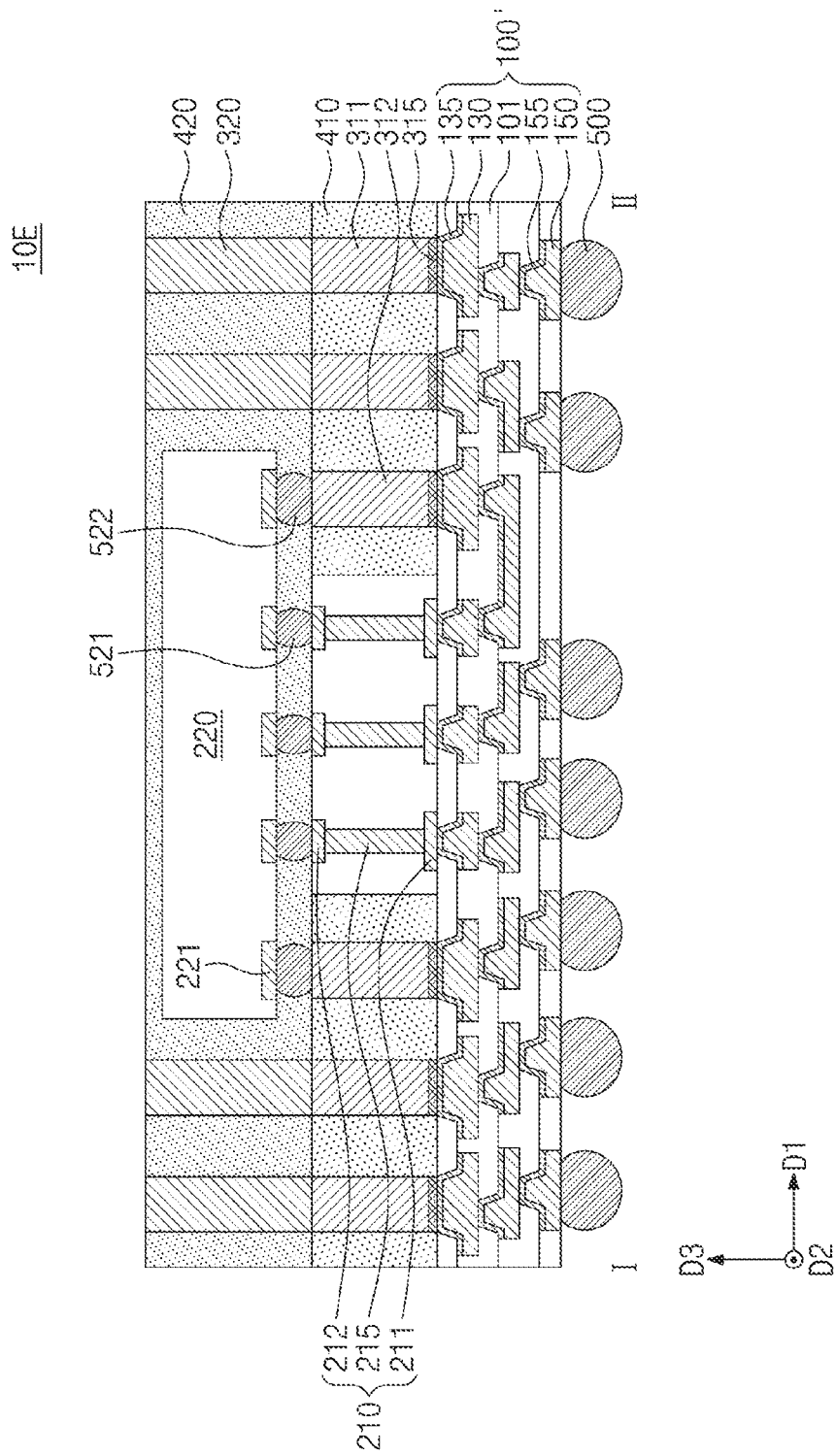
FIG. 5B illustrates a cross-sectional view showing a semiconductor package according to some embodiments.

FIG. 5B illustrates a cross-sectional view taken along line I-II of FIG. 1A, showing a semiconductor package according to some embodiments.

Referring to FIG. 5B, a semiconductor package 10E may include a first redistribution substrate 100', solder balls 500, lower and upper semiconductor chips 210 and 220, first and second lower conductive structures 311 and 312, upper conductive structures 320, first and second solder bumps 521 and 522, and lower and upper molding layers 410 and 420. The first redistribution substrate 100' may be substantially the same as the first redistribution substrate 100' discussed in the embodiment of FIG. 5A. In contrast, the semiconductor package 10E may include neither the lower bumps 510 nor the second redistribution substrate 600 discussed in FIG. 1B. The upper conductive structures 320 may have their top surfaces that are exposed by the upper molding layer 420.

Figure 6A:
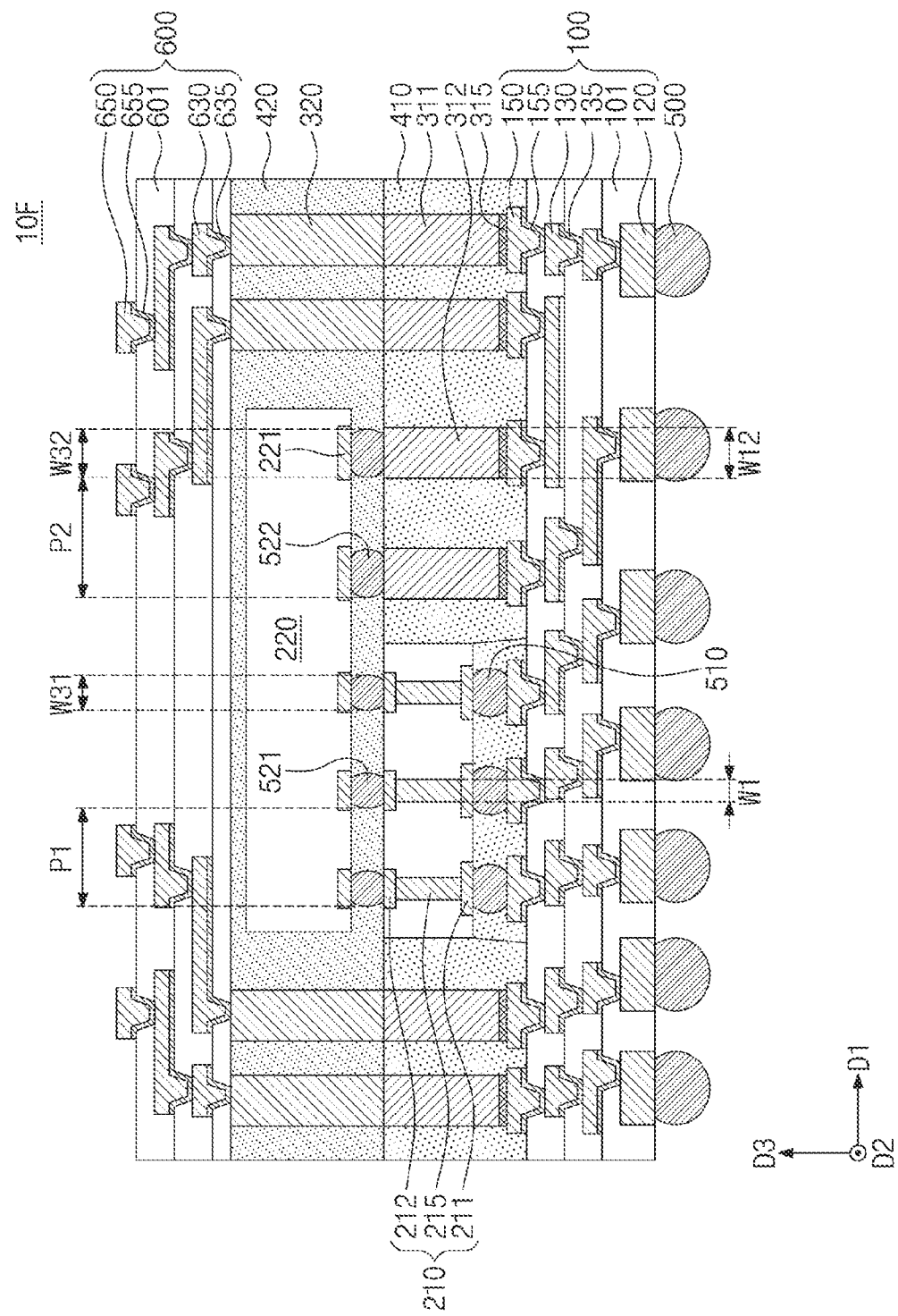
FIG. 6A illustrates a cross-sectional view showing a semiconductor package according to some embodiments.

FIG. 6A illustrates a cross-sectional view showing a semiconductor package according to some embodiments.

Referring to FIG. 6A, a semiconductor package 10F may include a first redistribution substrate 100, solder balls 500, lower and upper semiconductor chips 210 and 220, first and second lower conductive structures 311 and 312, upper conductive structures 320, first and second solder bumps 521 and 522, lower and upper molding layers 410 and 420, and a second redistribution substrate 600.

The upper semiconductor chip 220 may have a width greater than that of the lower semiconductor chip 210. The upper semiconductor chip 220 may have a first part and a second part that are respectively adjacent to a first lateral surface and a second lateral surface of the upper semiconductor chip 220. The second lateral surface of the upper semiconductor chip 220 may stand opposite to the first lateral surface of the upper semiconductor chip 220. The lower semiconductor chip 210 may be interposed between a top surface of the first redistribution substrate 100 and a bottom surface of the first part of the upper semiconductor chip 220. The second lower conductive structure 312 may be disposed between a top surface of the first redistribution substrate 100 and a bottom surface of the second part of the upper semiconductor chip 220. The second lower conductive structures 312 may be disposed on one side of the lower semiconductor chip 210.

The second width W12 of the second lower conductive structure 312 may be greater than the widths W1 of the through vias 215. The second lower conductive structure 312 may be provided in plural. A pitch of the plurality of second lower conductive structures 312 may be greater than that of the through vias 215.

The widths W32 of the second solder bumps 522 may be greater than the widths W31 of the first solder bumps 521. A pitch P2 of the second solder bumps 522 may be greater than a pitch P1 of the first solder bumps 521. The pitch P2 of the second solder bumps 522 may be an interval between first sidewalls of neighboring two second solder bumps 522. The first sidewalls of the second solder bumps 522 may be directed toward in a direction reverse to the first direction D1.

The chip pads 221, which are coupled to the second solder bumps 522, of the upper semiconductor chip 220 may have widths greater than those of the chip pads 221, which are coupled to the first solder bumps 521, of the upper semiconductor chip 220. A pitch of the chip pads 221, which are coupled to the second solder bumps 522, of the upper semiconductor chip 220 may be greater than that of the chip pads 221, which are coupled to the first solder bumps 521, of the upper semiconductor chip 220.

Figure 6B:
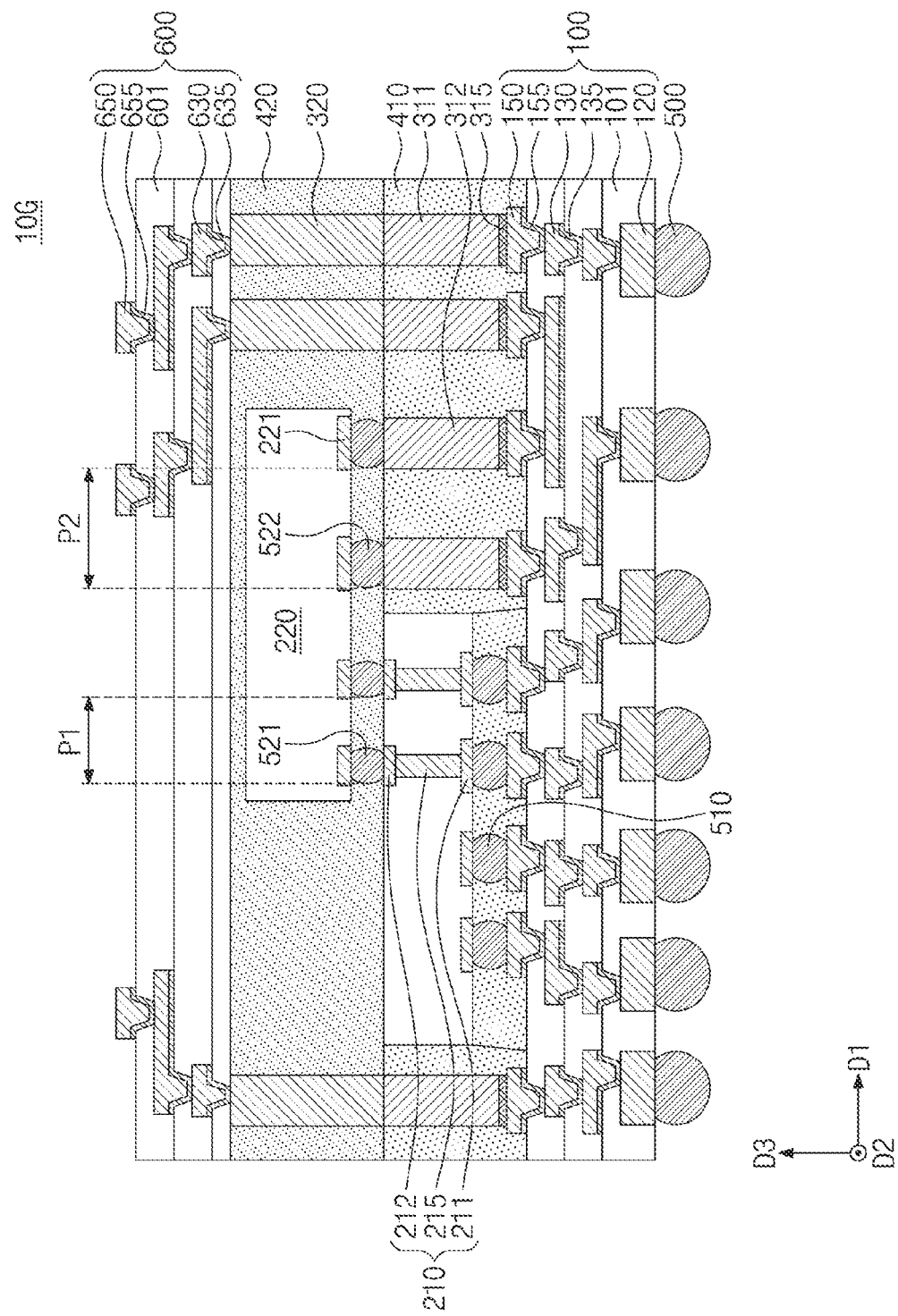
FIG. 6B illustrates a cross-sectional view showing a semiconductor package according to some embodiments.

FIG. 6B illustrates a cross-sectional view showing a semiconductor package according to some embodiments.

Referring to FIG. 6B, a semiconductor package 10G may include a first redistribution substrate 100, solder balls 500, lower and upper semiconductor chips 210 and 220, first and second lower conductive structures 311 and 312, upper conductive structures 320, first and second solder bumps 521 and 522, lower and upper molding layers 410 and 420, and a second redistribution substrate 600.

An arrangement of the lower semiconductor chip 210, the upper semiconductor chip 220, and the second lower conductive structures 312 may be substantially the same as that discussed above in the embodiment of FIG. 6A. For example, the second lower conductive structures 312 may be disposed on one side of the lower semiconductor chip 210. In contrast, the lower semiconductor chip 210 may have a width greater than that of the upper semiconductor chip 220. At least a portion of the lower semiconductor chip 210 may not vertically overlap the upper semiconductor chip 220. Differently from that shown, the width of the lower semiconductor chip 210 may be substantially the same as that of the upper semiconductor chip 220.

Some embodiments of the present disclosure may be combined with each other. For example, the second redistribution substrate 600 may not be included in one or more of the semiconductor package 10 of FIG. 1A, the semiconductor package 10A of FIG. 3A, the semiconductor package 10B of FIG. 3B, the semiconductor package 10C of FIGS. 4A and 4B, the semiconductor package 10F of FIG. 6A, and the semiconductor package 10G of FIG. 6B. For another example, the first redistribution substrate 100' discussed in the embodiment of FIG. 5A may not be included in one or more of the semiconductor package 10A of FIG. 3A, the semiconductor package 10B of FIG. 3B, the semiconductor package 10C of FIGS. 4A and 4B, the semiconductor package 10F of FIG. 6A, and the semiconductor package 10G of FIG. 6B. The embodiments may be variously combined with each other.

Figure 7A:
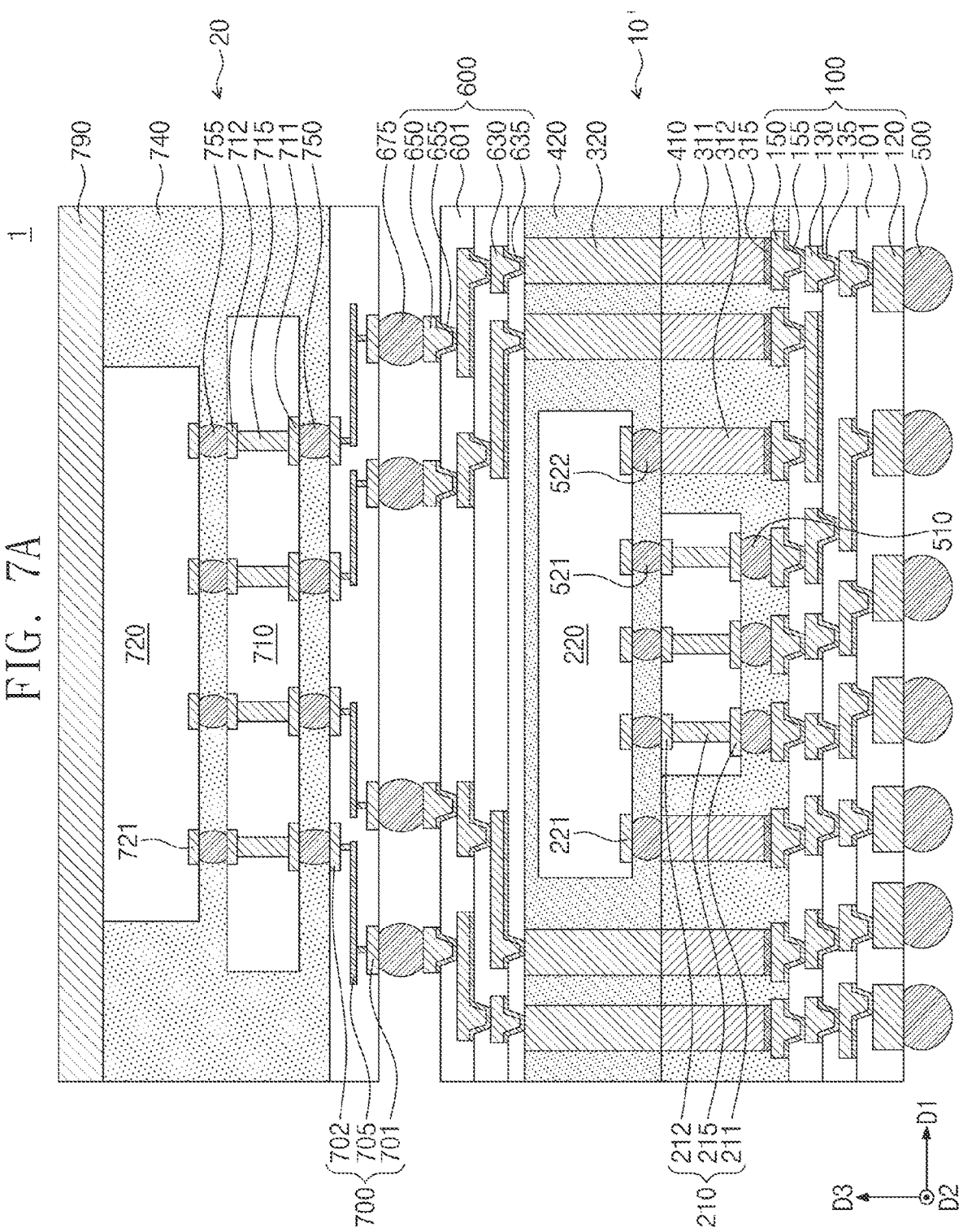
FIG. 7A illustrates a cross-sectional view showing a semiconductor package according to some embodiments.

FIG. 7A illustrates a cross-sectional view showing a semiconductor package according to some embodiments.

Referring to FIG. 7A, a semiconductor package 1 may include a lower package 10' and an upper package 20. The lower package 10' may be substantially the same as the semiconductor package 10 discussed in the embodiment of FIGS. 1A to 1D. For example, the lower package 10' may include a first redistribution substrate 100, solder balls 500, lower and upper semiconductor chips 210 and 220, first and second lower conductive structures 311 and 312, upper conductive structures 320, first and second solder bumps 521 and 522, lower and upper molding layers 410 and 420, and a second redistribution substrate 600. For another example, the lower package 10' may be substantially the same as one of the semiconductor package 10A of FIG. 3A, the semiconductor package 10B of FIG. 3B, the semiconductor package 10C of FIGS. 4A and 4B, the semiconductor package 10F of FIG. 6A, and the semiconductor package 10G of FIG. 6B.

The upper package 20 may include an upper substrate 700, a first semiconductor chip 710, a second semiconductor chip 720, and a molding pattern 740. The upper substrate 700 may be disposed on and spaced apart from a top surface of the second redistribution substrate 600. The upper substrate 700 may be a printed circuit board (PCB) or a redistribution layer. The upper substrate 700 may be provided with first substrate pads 701 and second substrate pads 702 respectively on a bottom surface and a top surface of the upper substrate 700. The upper substrate 700 may be provided therein with metal lines 705 coupled to the first substrate pads 701 and the second substrate pads 702.

The first semiconductor chip 710 may be mounted on the top surface of the upper substrate 700. The first semiconductor chip 710 may include first pads 711, conductive through vias 715, and second pads 712. The first pads 711 and the second pads 712 may be respectively disposed on a bottom surface and a top surface of the first semiconductor chip 710. The first semiconductor chip 710 may be provided therein with conductive through vias 715. The second pads 712 may be coupled through the conductive through vias 715 to the first pads 711. The first pads 711, the conductive through vias 715, and the second pads 712 may include, for example, metal.

The upper package 20 may further include first upper bumps 750. The first upper bumps 750 may be provided on the upper substrate 700 and the first semiconductor chip 710 and may be coupled to the second substrate pads 702 and the first pads 711. The first upper bumps 750 may include a solder material.

The second semiconductor chip 720 may be mounted on the first semiconductor chip 710. For example, the upper package 20 may further include second upper bumps 755. The second upper bumps 755 may be interposed between the second pads 712 and chip pads 721 of the second semiconductor chip 720 and may be electrically connected to the first semiconductor chip 710 and the second semiconductor chip 720. The second upper bumps 755 may include a solder material.

The second redistribution substrate 600 and the upper substrate 700 may be provided with connection bumps 675 therebetween. For example, connection bumps 675 may be provided between and coupled to the second redistribution pads 650 and the first substrate pads 701. Therefore, the first semiconductor chip 710 and the second semiconductor chip 720 may be electrically connected through the connection bumps 675 to the upper semiconductor chip 220, the lower semiconductor chip 210, or the solder balls 500.

The upper substrate 700 may be provided thereon with the molding pattern 740 that covers the first semiconductor chip 710 and the second semiconductor chip 720. The molding pattern 740 may expose a top surface of the second semiconductor chip 720. The molding pattern 740 may include a dielectric polymer, such as an epoxy-based molding compound.

The upper package 20 may further include a thermal radiation structure 790. The thermal radiation structure 790 may be disposed on the top surfaces of the second semiconductor chip 720 and a top surface of the molding pattern 740. The thermal radiation structure 790 may further include onto a lateral surface of the molding pattern 740. The thermal radiation structure 790 may include a heat sink, a heat slug, or a thermal interface material (TIM) layer. The thermal radiation structure 790 may include, for example, metal.

Figure 7B:
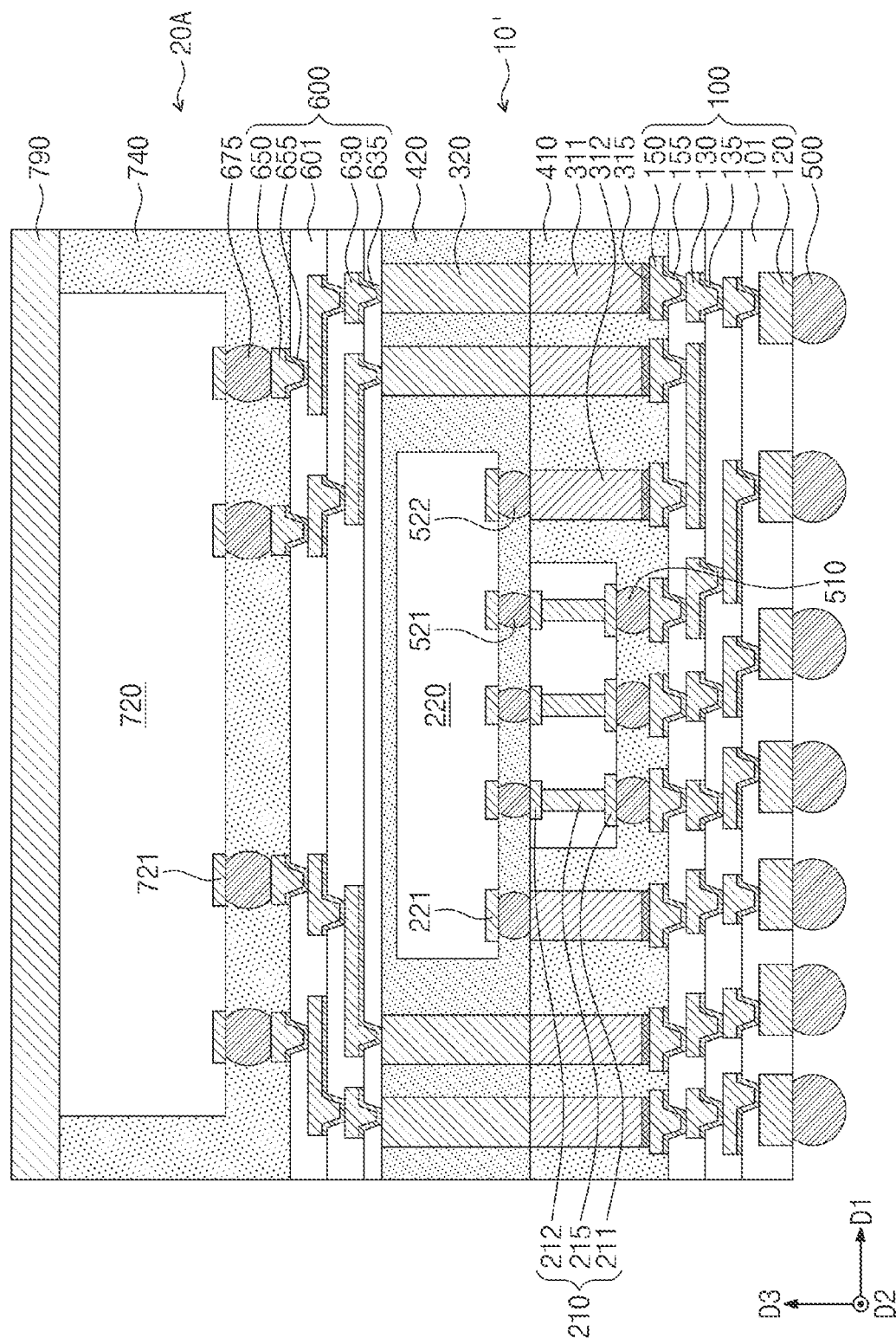
FIG. 7B illustrates a cross-sectional view showing a semiconductor package according to some embodiments.

FIG. 7B illustrates a cross-sectional view showing a semiconductor package according to some embodiments.

Referring to FIG. 7B, a semiconductor package 2 may include a lower package 10' and an upper package 20A. The lower package 10' may be substantially the same as that discussed in the embodiment of FIG. 7A.

The upper package 20A may include a second semiconductor chip 720 and a molding pattern 740. The upper package 20A may further include a thermal radiation structure 790. The upper package 20A may include none of the first upper bumps 750, the first semiconductor chip 710, and the second upper bumps 755 discussed in FIG. 7A. The second semiconductor chip 720 may be disposed on a top surface of the second redistribution substrate 600. The second redistribution substrate 600 and the second semiconductor chip 720 may be provided therebetween with connection bumps 675 that are coupled to the second redistribution pads 650 and chip pads 721 of the second semiconductor chip 720. The molding pattern 740 may be directly disposed on the second redistribution substrate 600. The molding pattern 740 may further extend onto a bottom surface of the second semiconductor chip 720 to encapsulate the connection bumps 675. Alternatively, an under-fill pattern (not shown) may be interposed between the second redistribution substrate 600 and the second semiconductor chip 720.

Figure 7C:
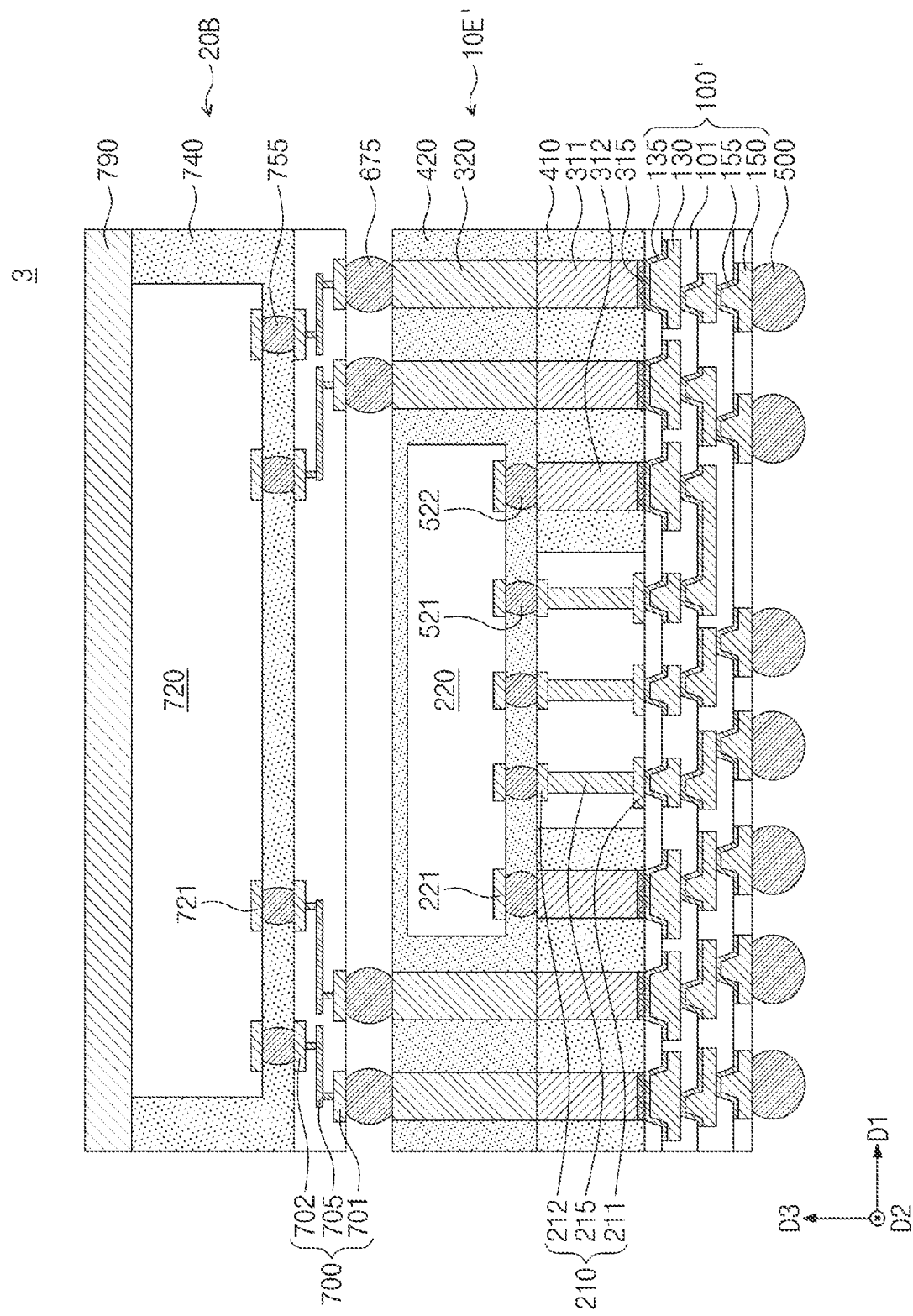
FIG. 7C illustrates a cross-sectional view showing a semiconductor package according to some embodiments.

FIG. 7C illustrates a cross-sectional view showing a semiconductor package according to some embodiments.

Referring to FIG. 7C, a semiconductor package 3 may include a lower package 10E' and an upper package 20B. The lower package 10E' may be substantially the same as the semiconductor package 10E discussed in the embodiment of FIG. 5B. The upper package 20B may include an upper substrate 700, a second semiconductor chip 720, second upper bumps 755, and a molding pattern 740. The second upper bumps 755 may be disposed between the upper substrate 700 and the second semiconductor chip 720 and may be coupled to the second substrate pads 702 and chip pads 721 of the second semiconductor chip 720. The upper package 20B may further include a thermal radiation structure 790.

The upper conductive structures 320 and the upper substrate 700 may be provided therebetween with connection bumps 675 that are coupled to the upper conductive structures 320 and the first substrate pads 701. For example, the connection bumps 675 may be in direct contact with top surfaces of the upper conductive structures 320.

It may be possible to combine with each other the embodiment of the semiconductor package 1 depicted in FIG. 7A, the embodiment of the semiconductor package 2 depicted in FIG. 7B, and the embodiment of the semiconductor package 3 depicted in FIG. 7C. For example, the semiconductor package 3 of FIG. 7C may include the upper package 20 of FIG. 7A or the upper package 20A of FIG. 7B. The embodiments may be variously combined with each other.

The following will now discuss a method of fabricating a semiconductor package according to some embodiments.

FIGS. 8A to 8M illustrate cross-sectional views taken along line I-II of FIG. 1A, showing a method of fabricating a semiconductor package according to some embodiments.

Referring to FIG. 8A, under-bump patterns 120, a first dielectric layer 101, first seed patterns 135, and first redistribution patterns 130 may be formed on a carrier substrate 900. According to some embodiments, an electroplating process may be performed to form under-bump patterns 120 on the carrier substrate 900. The first dielectric layer 101 may be formed on the carrier substrate 900 to cover sidewalls and top surfaces of the under-bump patterns 120. First openings 109 may be formed in the first dielectric layer 101 to expose the under-bump patterns 120.

The formation of the first seed patterns 135 and the first redistribution patterns 130 may include forming a first seed layer (not shown) in the first openings 109 and on a top surface of the first dielectric layer 101, forming a resist pattern (not shown) on the first seed layer, performing an electroplating process in which the first seed layer is used as an electrode, removing the resist pattern to expose a portion of the first seed layer, and etching the exposed portion of the first seed layer.

The electroplating process may form the first redistribution patterns 130 in the first openings 109 and in a lower portion of the resist pattern. Each of the first redistribution patterns 130 may include a first via part and a first wire part. The first via part may be formed in a corresponding first opening 109, and the first wire part may be formed on the first via part and on the first dielectric layer 101. The etching of the first seed layer may correspondingly form the first seed patterns 135 on bottom surfaces of the first redistribution patterns 130.

Referring to FIG. 8B, the formation of the first dielectric layer 101, the formation of the first seed patterns 135, and the formation of the first redistribution patterns 130 may be performed repeatedly. Therefore, stacked first dielectric layers 101 may be formed, and stacked first redistribution patterns 130 may be formed.

First redistribution pads 150 may be formed in corresponding first openings 109 of an uppermost first dielectric layer 101, thereby being coupled to the first redistribution patterns 130. Before the first redistribution pads 150 are formed, first seed pads 155 may be formed. An electroplating process may be performed in which the first seed pads 155 are used as electrodes to form the first redistribution pads 150. Therefore, a first redistribution substrate 100 may be manufactured. The first redistribution substrate 100 may include the first dielectric layers 101, the under-bump patterns 120, the first seed patterns 135, the first redistribution patterns 130, the first seed pads 155, and the first redistribution pads 150.

Figure 8C:
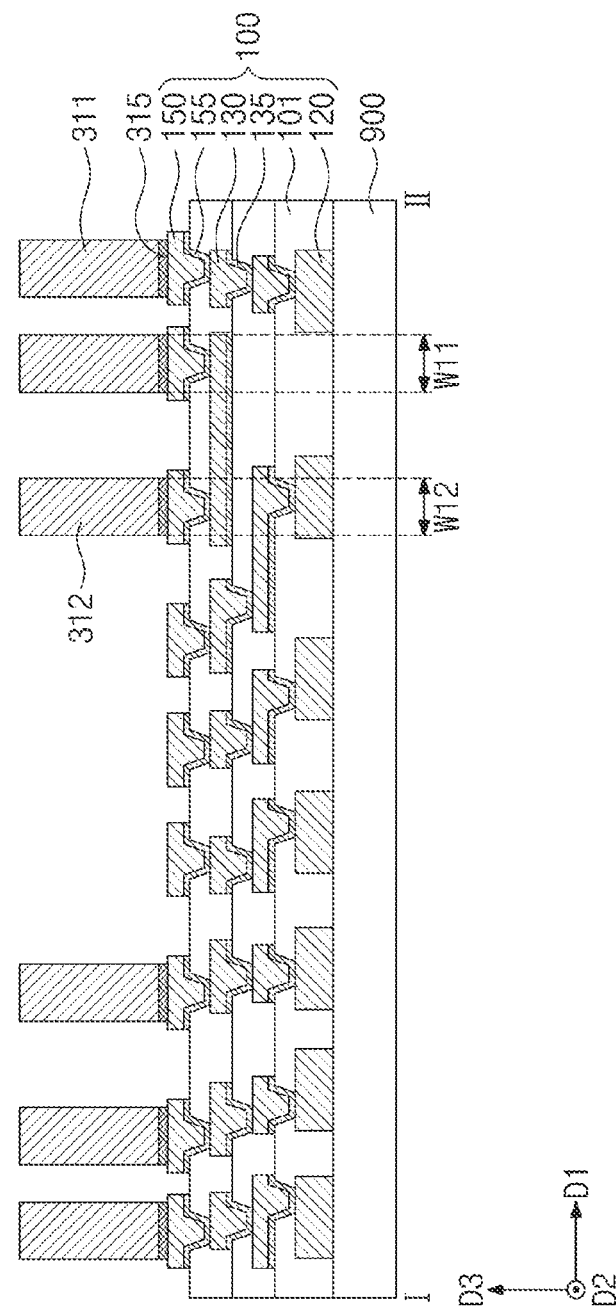

Referring to FIG. 8C, conductive seed patterns 315 may be formed on the first redistribution pads 150. An electroplating process may be performed in which the conductive seed patterns 315 are used as electrodes to form first lower conductive structures 311 and second lower conductive structures 312. The first and second lower conductive structures 311 and 312 may be correspondingly formed on the conductive seed patterns 315. For example, the second lower conductive structures 312 and the first lower conductive structures 311 may be formed in a single process. Accordingly, semiconductor package fabrication may be simplified. The second lower conductive structure 312 may include the same material as that of the first lower conductive structure 311. A second width W12 of the second lower conductive structure 312 may be the same as or similar to the first width W11 of the first lower conductive structure 311.

Figure 8D:
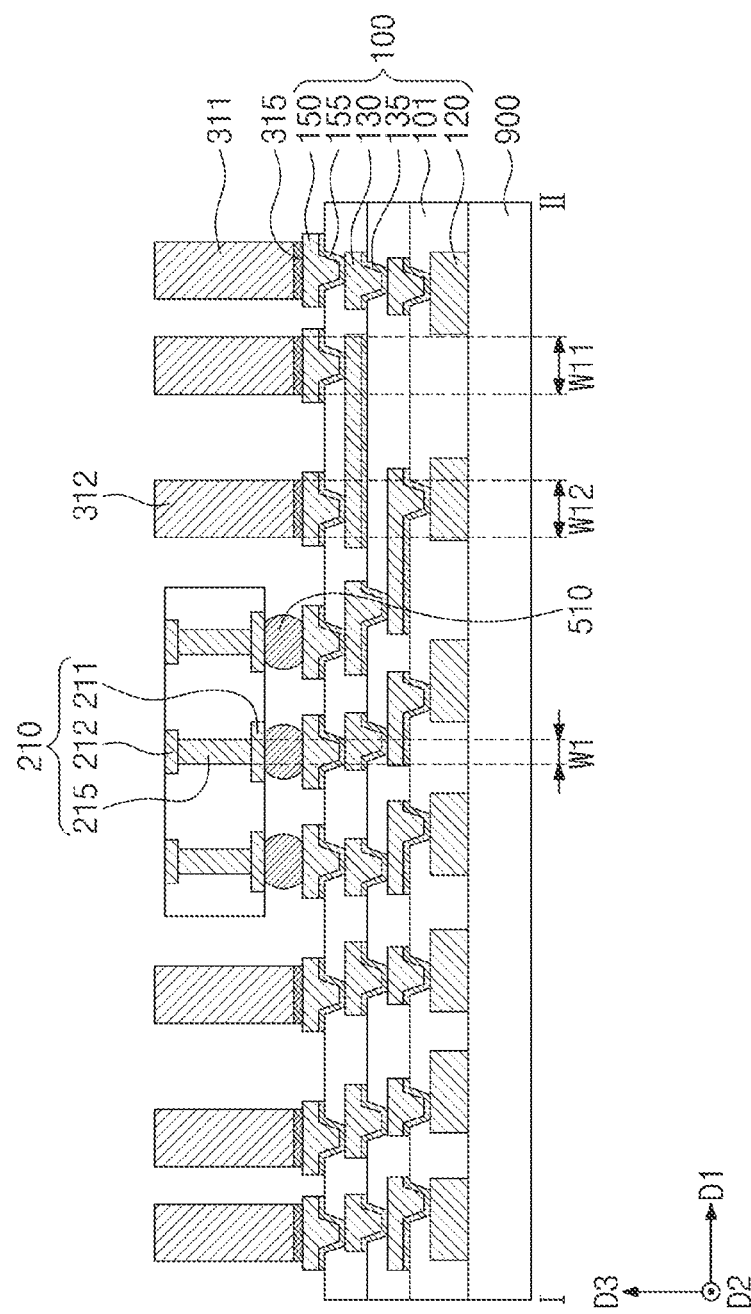

Referring to FIG. 8D, a lower semiconductor chip 210 may be mounted on a top surface of the first redistribution substrate 100. The lower semiconductor chip 210 may include lower pads 211, through vias 215, and upper pads 212. The mounting of the lower semiconductor chip 210 may include forming lower bumps 510 between the first redistribution substrate 100 and the lower semiconductor chip 210. The lower bumps 510 may be coupled to the first redistribution pads 150 and the lower pads 211. A width W1 of each of the through vias 215 may be less than the first width W11 and the second width W12.

Figure 8E:
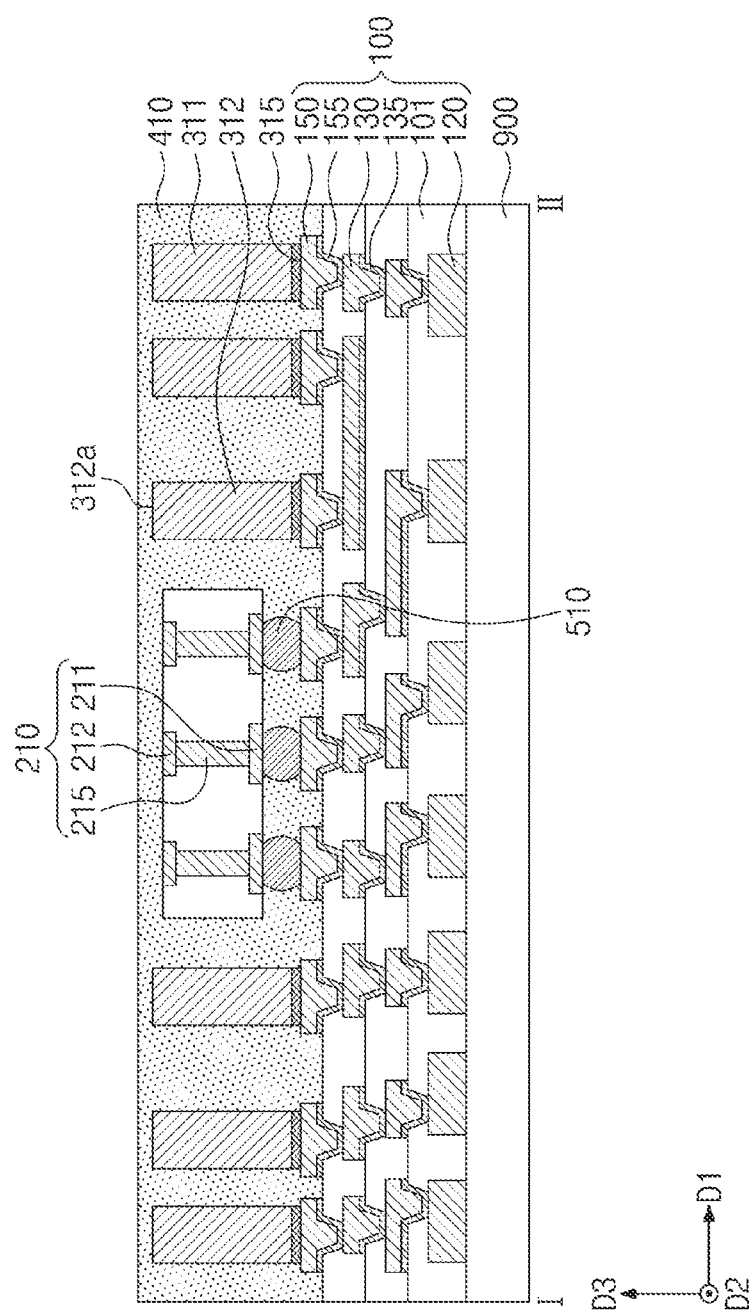

Referring to FIG. 8E, a lower molding layer 410 may be formed on the top surface of the first redistribution substrate 100 to cover the lower semiconductor chip 210, the first lower conductive structures 311, and the second lower conductive structures 312. For example, the lower molding layer 410 may cover a top surface of the lower semiconductor chip 210, top surfaces of the first lower conductive structures 311, and top surfaces 312a of the second lower conductive structures 312. The lower molding layer 410 may have a top surface located at a higher level than that of the top surface of the lower semiconductor chip 210, that of the top surfaces of the first lower conductive structures 311, and that of the top surfaces 312a of the second lower conductive structures 312. The top surface of the lower semiconductor chip 210 may include top surfaces of the upper pads 212.

Figure 8F:
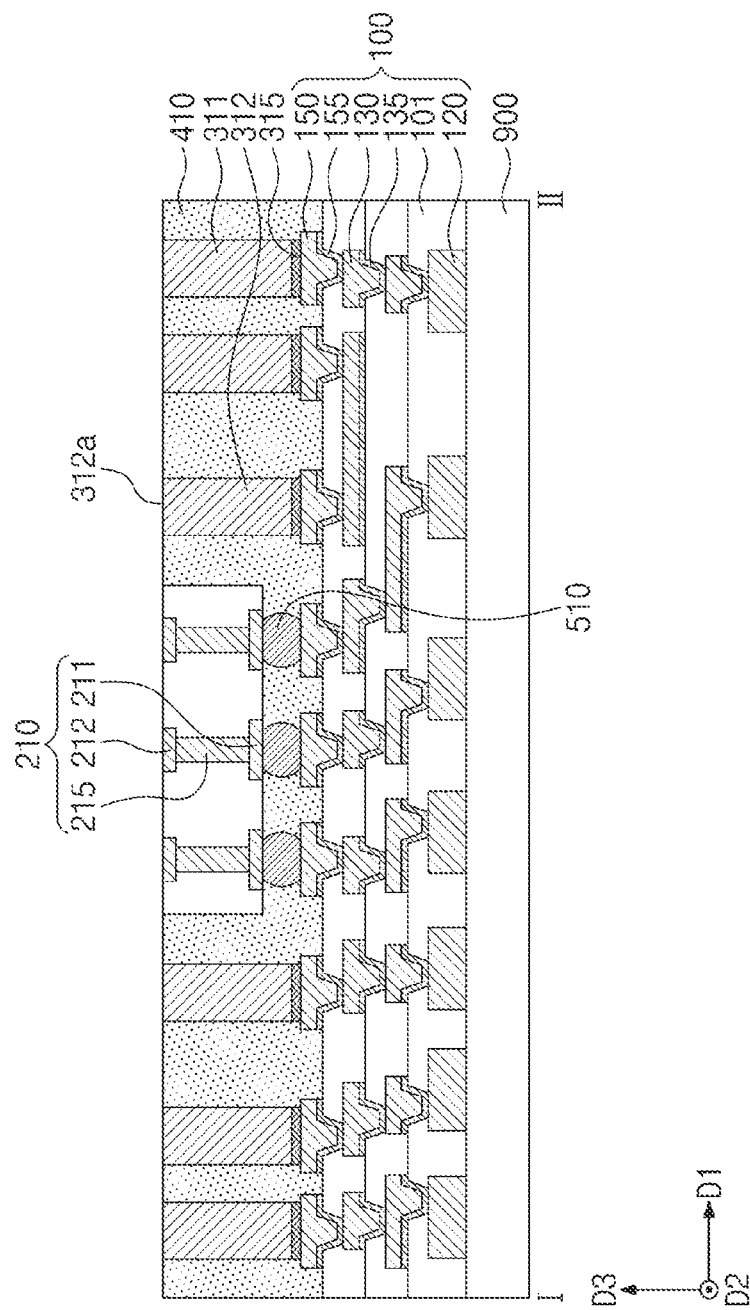

Referring to FIG. 8F, the lower molding layer 410 may undergo a grinding process to remove a portion of the lower molding layer 410. For example, the grinding process may include a chemical mechanical polishing process. The grinding process may expose the top surfaces of the first lower conductive structures 311, the top surfaces 312a of the second lower conductive structures 312, and the top surface of the lower semiconductor chip 210. For example, the upper pads 212 of the lower semiconductor chip 210 may be exposed. After the grinding process is terminated, the exposed top surfaces 312a of the second lower conductive structures 312 may be located at substantially the same level as that of the top surface of the lower molding layer 410, that of the top surfaces of the first lower conductive structures 311, and that of the top surface of the lower semiconductor chip 210.

Figure 8G:
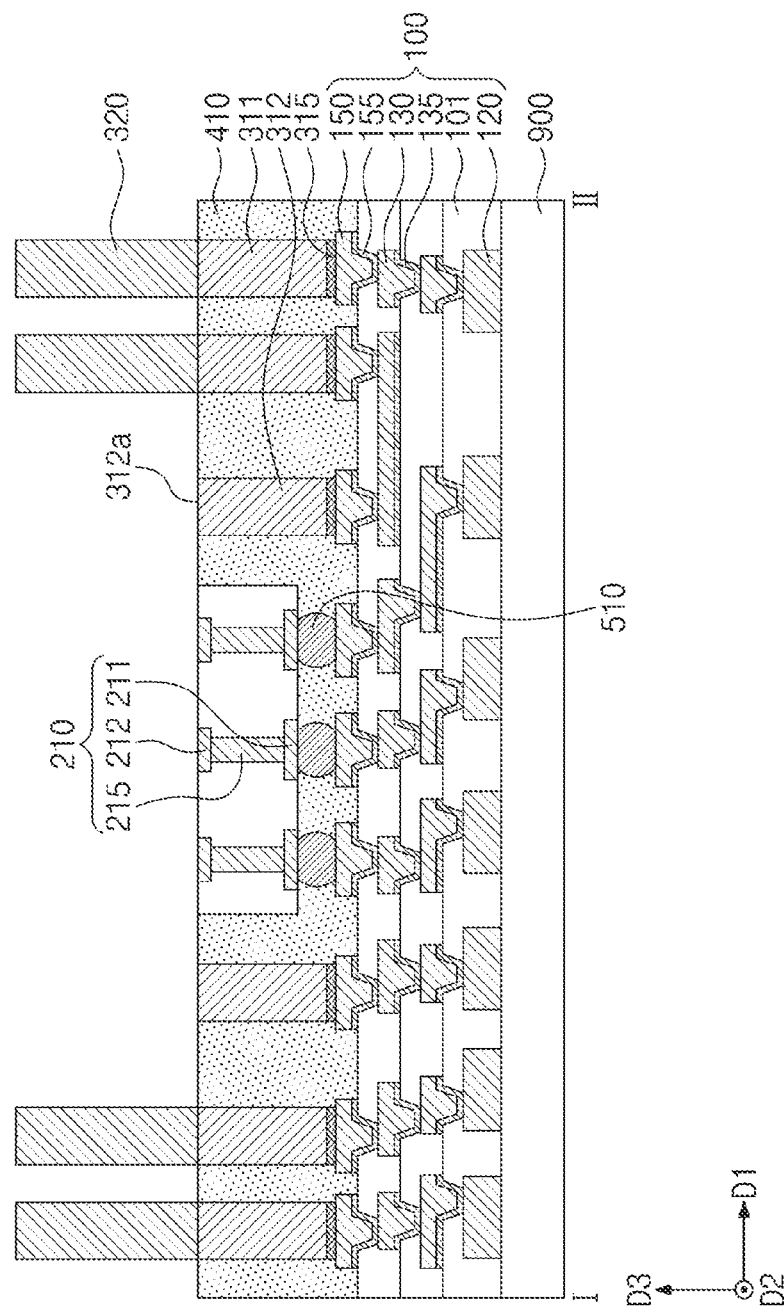

Referring to FIG. 8G, upper conductive structures 320 may be correspondingly formed on the first lower conductive structures 311. According to some embodiments, an electroplating process may be performed in which the first lower conductive structures 311 are used as electrodes to form the upper conductive structures 320. Alternatively, upper seed patterns (see 324 of FIG. 2A) may be formed on the first lower conductive structures 311. An electroplating process may be performed in which the upper seed patterns 325 (not shown) are used as electrodes to form the upper conductive structures 320. The upper conductive structures 320 may not be formed on the second lower conductive structures 312.

Figure 8H:
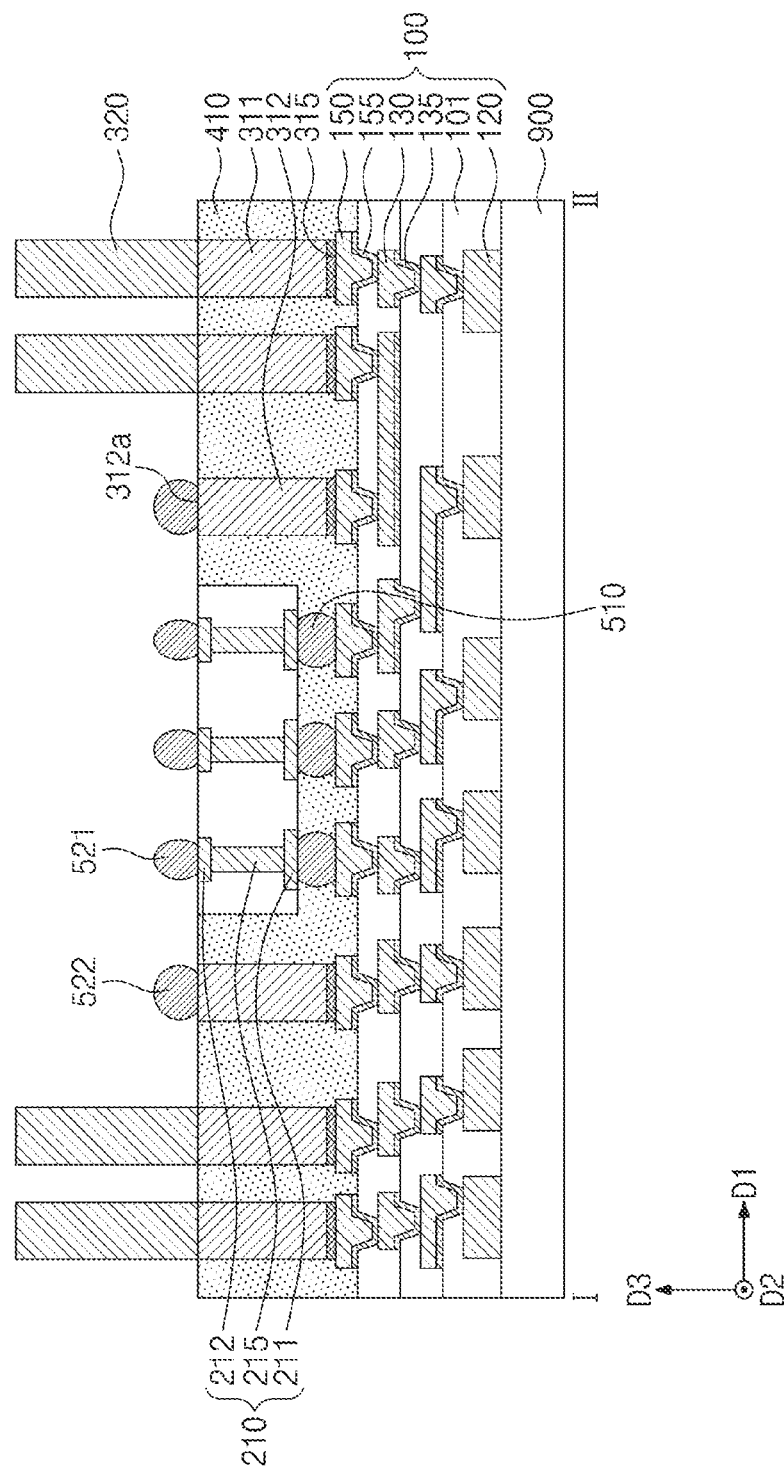

Referring to FIG. 8H, first solder bumps 521 may be formed on the upper pads 212, and second solder bumps 522 may be formed on the top surfaces 312a of the second lower conductive structures 312. The formation of the first and second solder bumps 521 and 522 may include attaching solder balls.

Figure 8I:
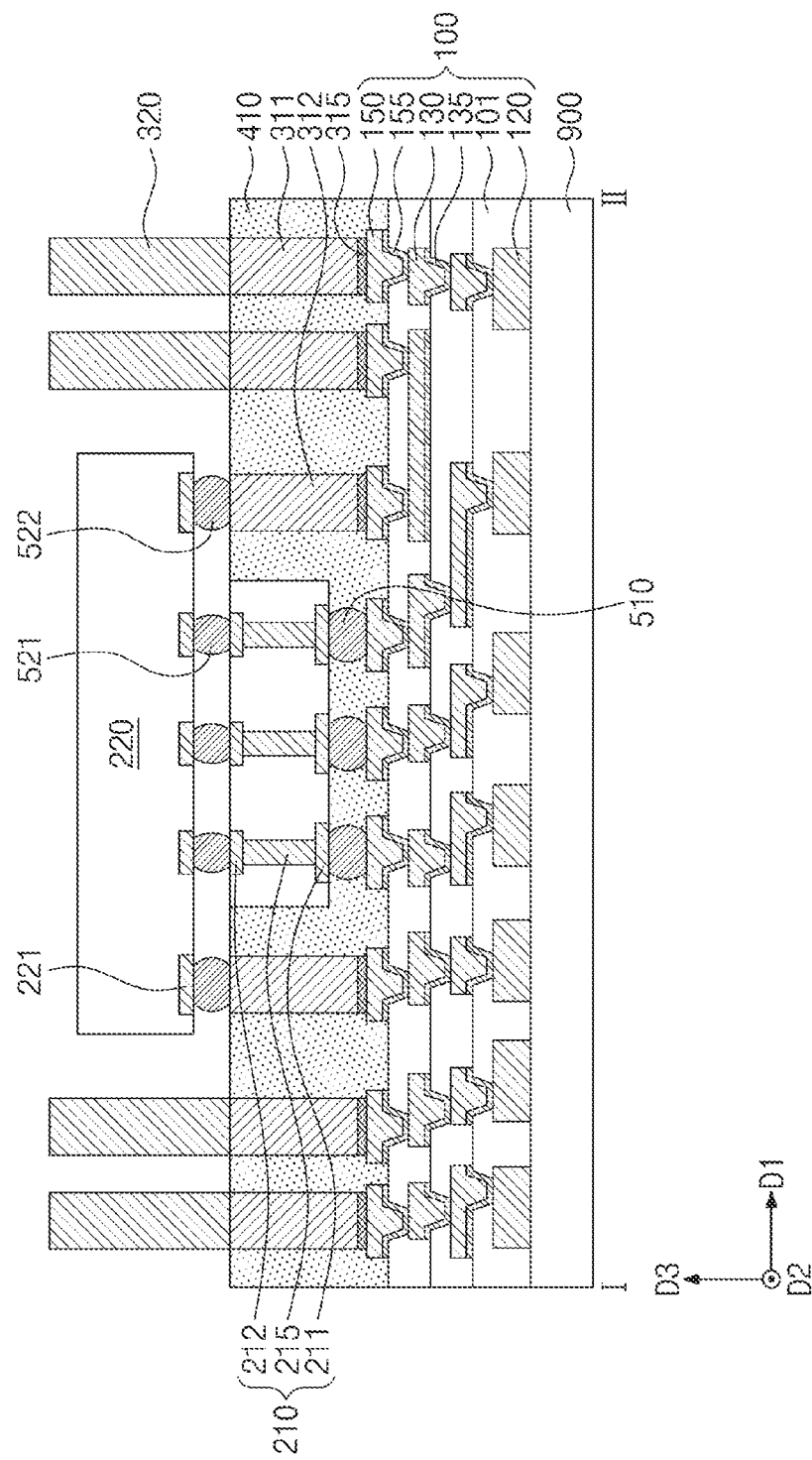

Referring to FIG. 8I, an upper semiconductor chip 220 may be disposed on the lower semiconductor chip 210 and the second lower conductive structure 312. The upper semiconductor chip 220 may have chip pads 221 coupled to the first solder bumps 521 or the second solder bumps 522. Therefore, the upper semiconductor chip 220 may be electrically connected to the lower semiconductor chip 210 and the second lower conductive structure 312.

Figure 8J:
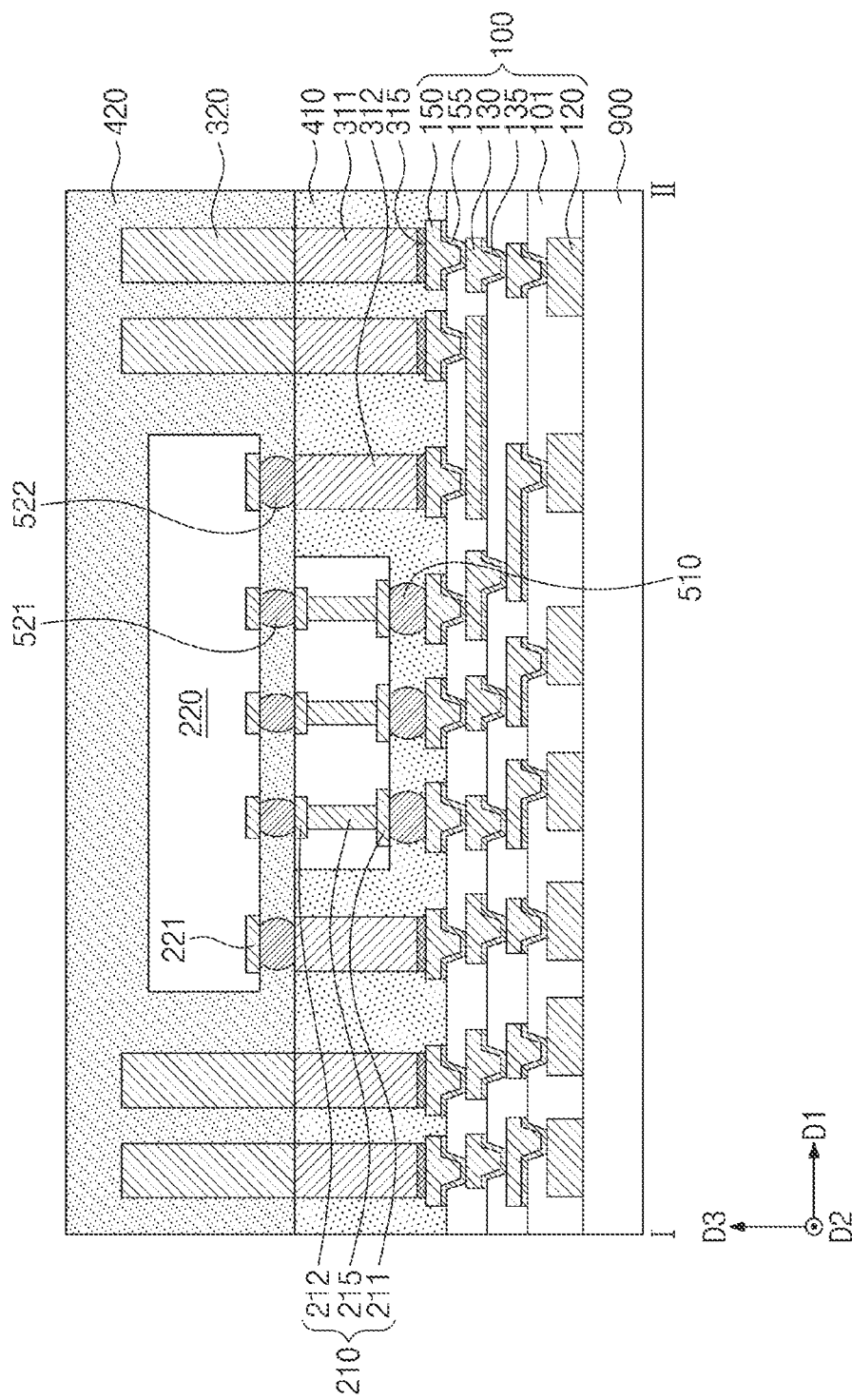

Referring to FIG. 8J, an upper molding layer 420 may be formed on the lower molding layer 410 to cover the upper semiconductor chip 220 and the upper conductive structures 320. The upper molding layer 420 may cover a top surface of the upper semiconductor chip 220 and top surfaces of the upper conductive structures 320. The upper molding layer 420 may have a top surface located at a higher level than that of the top surface of the upper semiconductor chip 220 and that of the top surfaces of the upper conductive structures 320. The upper molding layer 420 may further extend onto a bottom surface of the upper semiconductor chip 220 to cover the first solder bumps 521 and the second solder bumps 522.

Figure 8K:
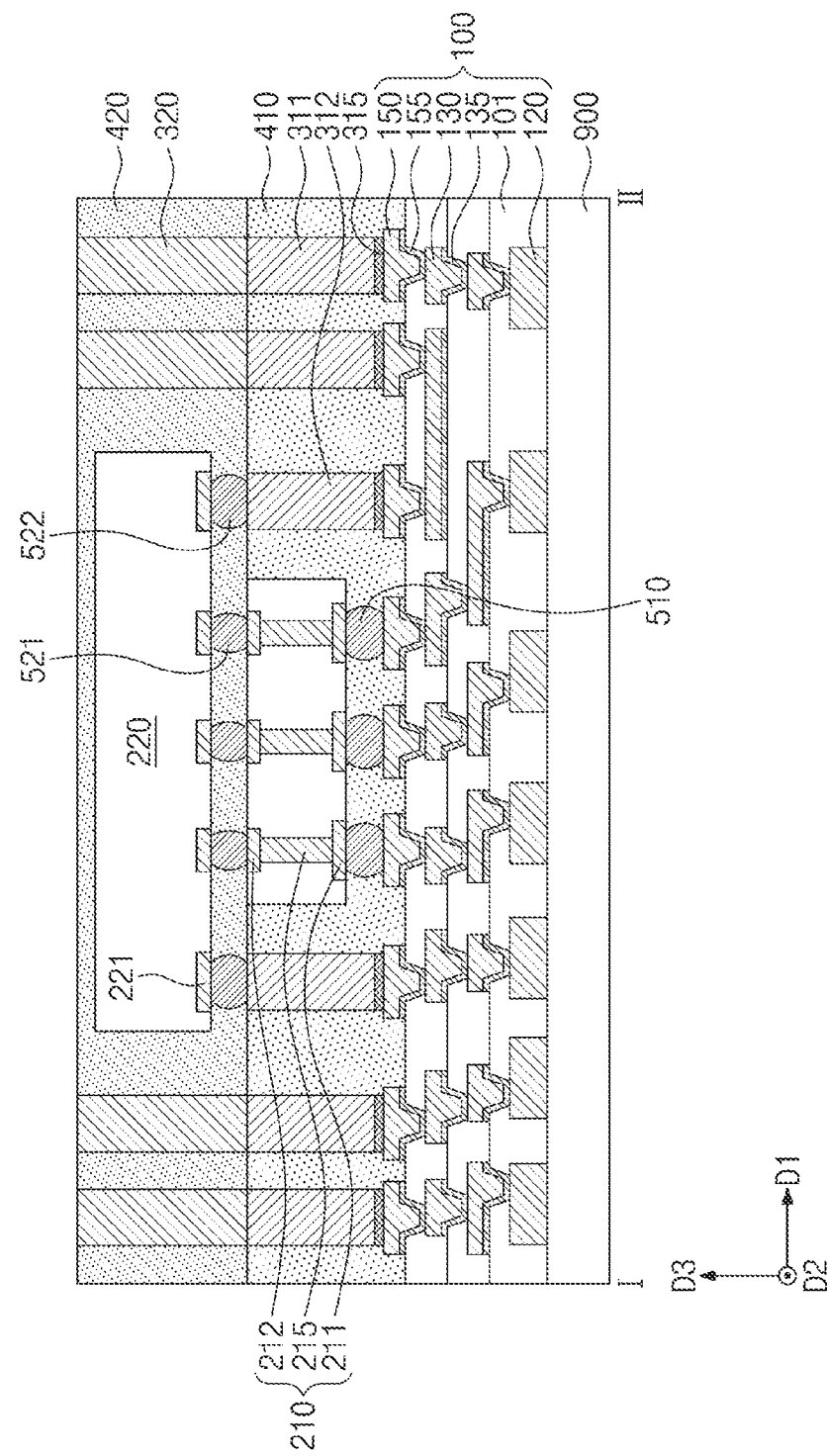

Referring to FIG. 8K, the upper molding layer 420 may undergo a grinding process to expose the top surfaces of the upper conductive structures 320. For example, the grinding process may include a chemical mechanical polishing process. After the grinding process is terminated, the exposed top surface of the upper conductive structure 320 may be located at substantially the same level as that of the top surface of the upper molding layer 420. The top surface of the upper semiconductor chip 220 may be covered with the upper molding layer 420. Alternatively, the top surface of the upper semiconductor chip 220 may be exposed without being covered with the upper molding layer 420.

Figure 8L:
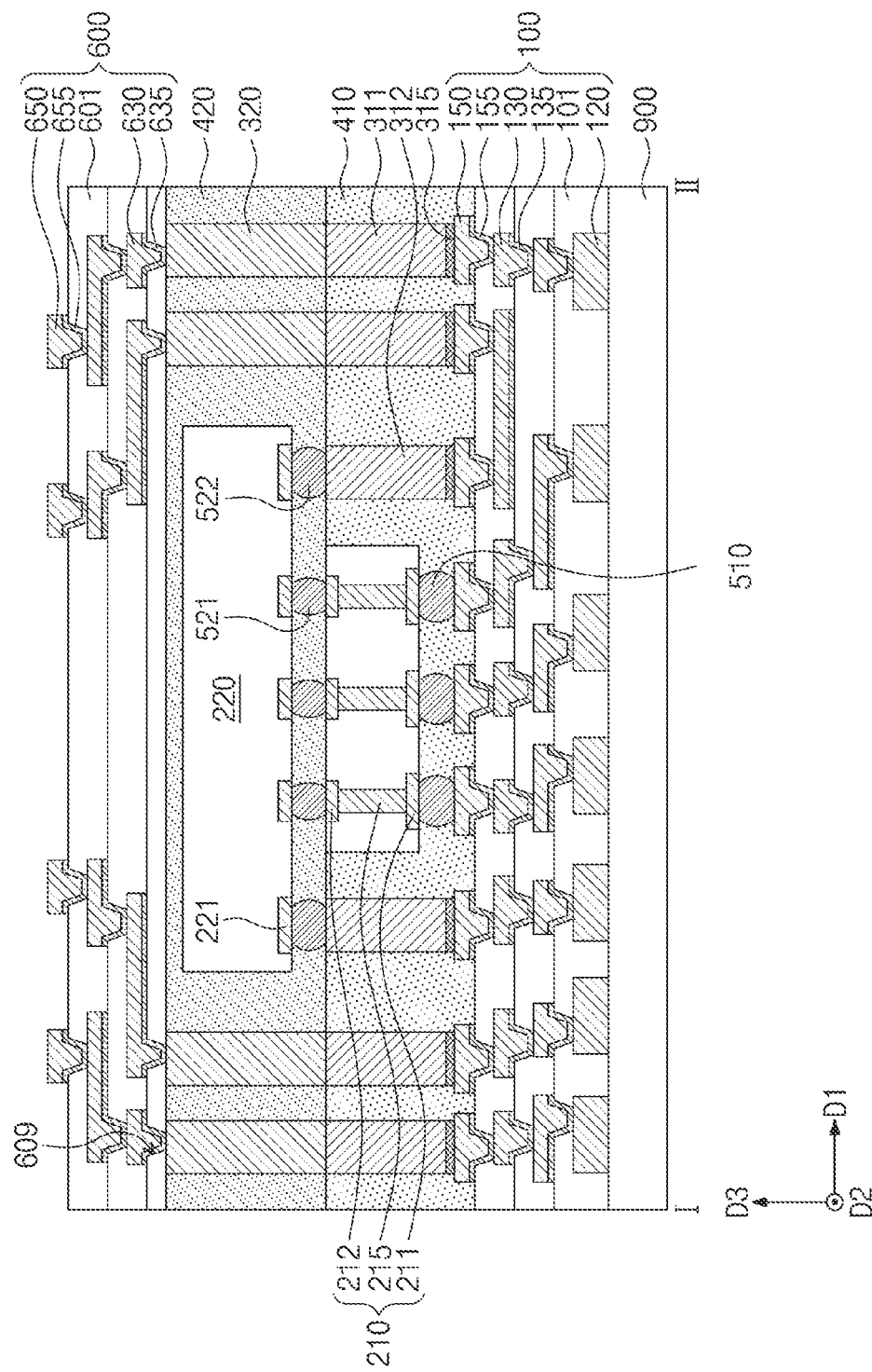

Referring to FIG. 8L, a second dielectric layer 601, second seed patterns 635, second redistribution patterns 630, second seed pads 655, and second redistribution pads 650 may be formed on the upper molding layer 420 and the upper conductive structures 320, which may fabricate a second redistribution substrate 600.

According to some embodiments, the second dielectric layer 601 may be formed on the top surface of the upper molding layer 420. Second openings 609 may be formed in the second dielectric layer 601 to expose the top surfaces of the upper conductive structures 320. The second seed patterns 635 may be formed in the second openings 609 and on a top surface of the second dielectric layer 601. The second redistribution patterns 630 may be formed in the second openings 609 and on the top surface of the second dielectric layer 601, thereby covering the second seed patterns 635.

Each of the second redistribution patterns 630 may include a second via part and a second wire part. The second via part may be formed in a corresponding second opening 609. The second wire part may be formed on the second via part and may extend onto the top surface of the second dielectric layer 601. The formation of the second seed patterns 635 and the second redistribution patterns 630 may be the same as or similar to that of the first seed patterns 135 and the first redistribution patterns 130 discussed in the embodiment of FIG. 8A. The formation of the second dielectric layer 601, the formation of the second seed patterns 635, and the formation of the second redistribution patterns 630 may be performed repeatedly. Accordingly, there may be formed a plurality of stacked second dielectric layers 601, a plurality of second seed patterns 635, and a plurality of stacked second redistribution patterns 630.

The second redistribution pads 650 may be formed in an uppermost second dielectric layer 601 and on a top surface of the uppermost second dielectric layer 601. Before the second redistribution pads 650 are formed, second seed pads 655 may be formed. The second redistribution pads 650 may be formed by an electroplating process in which the second seed pads 655 are used as electrodes. Therefore, a second redistribution substrate 600 may be manufactured. The second redistribution substrate 600 may include the second dielectric layers 601, the second seed patterns 635, the second redistribution patterns 630, the second seed pads 655, and the second redistribution pads 650.

Figure 8M:
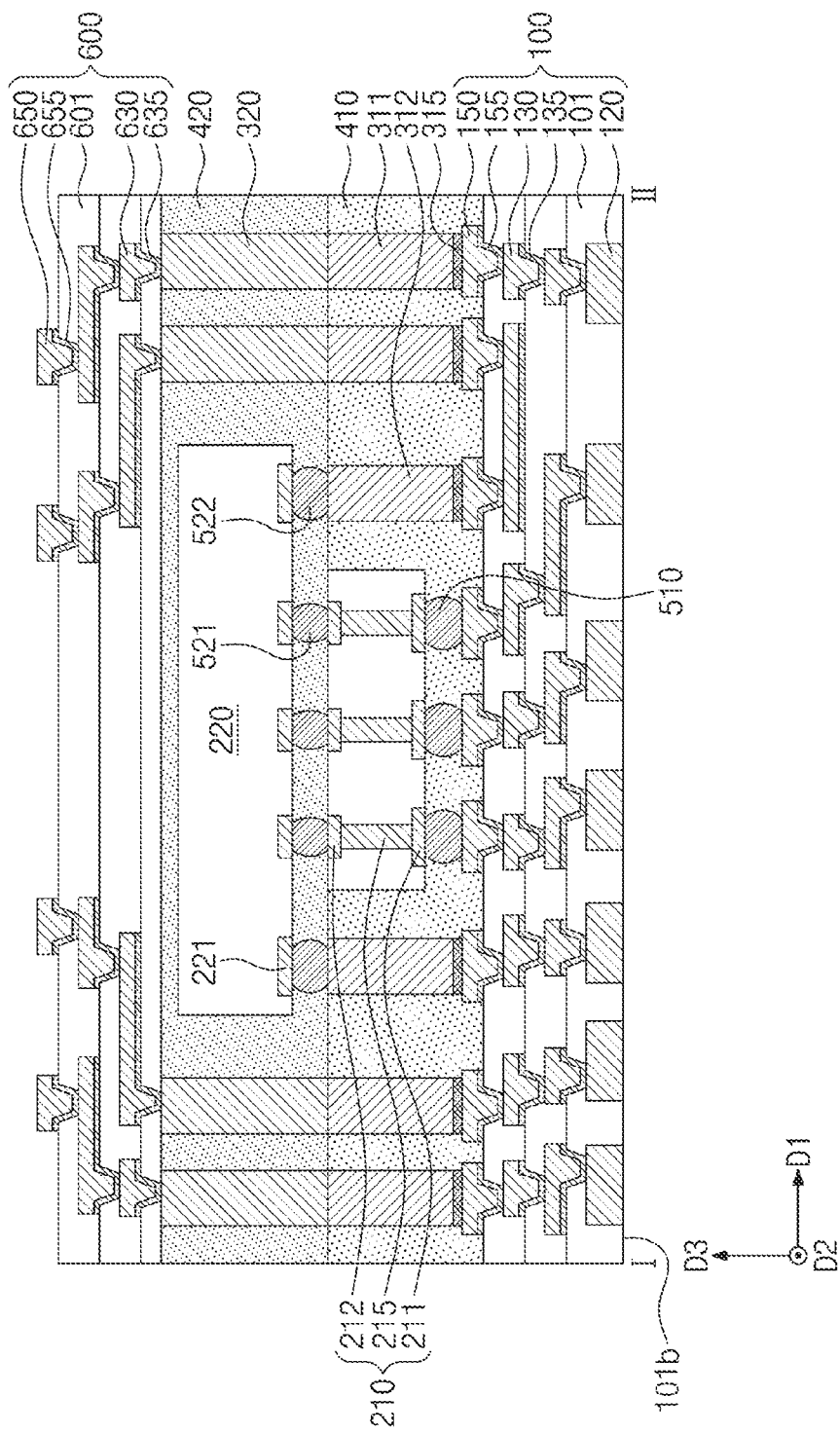

Referring to FIG. 8M, the carrier substrate 900 may be removed to expose a bottom surface 101b of the first redistribution substrate 100. For example, there may be exposed a bottom surface of a lowermost first dielectric layer 101 and bottom surfaces of the under-bump patterns 120.

Referring back to FIG. 1B, solder balls 500 may be correspondingly formed on bottom surfaces of the under-bump patterns 120, thereby being coupled to the under-bump patterns 120. Through the processes discussed above, a semiconductor package 10 may be eventually fabricated.

According to the present disclosure, an upper conductive structure may be disposed on a first lower conductive structure and a top surface of the upper conductive structure may be located at a relatively high level. An upper semiconductor chip may be stacked on a lower semiconductor chip and may be laterally spaced apart from the upper conductive structure. As the upper conductive structure is provided, there may be a reduction in a limitation imposed on a thickness of the upper semiconductor chip and an improvement in thermal properties of the upper semiconductor chip.

The upper semiconductor chip may be disposed on the lower semiconductor chip and a second lower conductive structure and may be electrically connected to the second lower conductive structure and through vias of the lower semiconductor chip. Therefore, there may be a distribution of electrical paths for the upper semiconductor chip. The upper semiconductor chip may increase in electrical properties.

The second lower conductive structure and the first lower conductive structure may be formed in a single process and, thus, semiconductor package fabrication may be simplified.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

This detailed description of the present disclosure should not be construed as limited to the embodiments set forth herein, and it is intended that the present disclosure cover the various combinations, the modifications and variations of this disclosure without departing from the spirit and scope of the present disclosure.

What is claimed is:

1. A semiconductor package comprising:
  a first redistribution substrate;
  a lower semiconductor chip on the first redistribution substrate, the lower semiconductor chip including a through via therein;
  a first lower conductive structure and a second lower conductive structure that are on the first redistribution substrate and are laterally spaced apart from the lower semiconductor chip;
  an upper semiconductor chip on the lower semiconductor chip and the second lower conductive structure, the upper semiconductor chip being coupled to the through via and the second lower conductive structure;
  an upper conductive structure on the first lower conductive structure; and an upper molding layer covering a sidewall of the upper semiconductor chip and a sidewall of the upper conductive structure, wherein a width of the second lower conductive structure is greater than a width of the through via, and wherein the upper conductive structure comprises an upper post laterally spaced apart from the upper semiconductor chip.

2. The semiconductor package of claim 1, further comprising:
a plurality of first solder bumps between the lower semiconductor chip and the upper semiconductor chip; and
a second solder bump between the second lower conductive structure and the upper semiconductor chip.

3. The semiconductor package of claim 2, wherein:
a top surface of the second lower conductive structure is at a level substantially the same as a level of a top surface of the lower semiconductor chip, and
a width of the second solder bump is greater than widths of the first solder bumps.

4. The semiconductor package of claim 1, wherein:
the through via is a signal through via, and
the second lower conductive structure is configured to receive a voltage.

5. The semiconductor package of claim 1, further comprising a lower molding layer on the first redistribution substrate, the lower molding layer covering a sidewall of the first lower conductive structure, a sidewall of the second lower conductive structure, and a sidewall of the lower semiconductor chip,
wherein the upper molding layer is in contact with a top surface of the lower molding layer.

6. The semiconductor package of claim 1, wherein the upper semiconductor chip includes:
a first part that overlaps the lower semiconductor chip and is spaced apart from the second lower conductive structure, in a plan view; and
a second part that overlaps the second lower conductive structure and is spaced apart from the lower semiconductor chip, in a plan view.

7. The semiconductor package of claim 1, wherein:
a height of the second lower conductive structure is the same as a height of the first lower conductive structure, and
the width of the second lower conductive structure is different from a width of the first lower conductive structure.

8. The semiconductor package of claim 1, wherein:
the upper conductive structure directly contacts the first lower conductive structure,
the upper conductive structure includes a material the same as a material of the first lower conductive structure, and
the upper conductive structure has a grain different from a grain of the first lower conductive structure.

9. A semiconductor package comprising:
a first redistribution substrate;
a lower semiconductor chip on the first redistribution substrate, the lower semiconductor chip including a through via therein;
a first lower conductive structure disposed on the first redistribution substrate and laterally spaced apart from the lower semiconductor chip;
a second lower conductive structure disposed on the first redistribution substrate and laterally spaced apart from the lower semiconductor chip and the first lower conductive structure;

an upper conductive structure on the first lower conductive structure; and
an upper semiconductor chip on a top surface of the lower semiconductor chip and a top surface of the second lower conductive structure; and
a molding pattern covering a sidewall of the upper semiconductor chip and a sidewall of the upper conductive structure,
wherein the upper semiconductor chip is coupled to the through via and the second lower conductive structure, and
wherein the upper conductive structure comprises an upper post laterally spaced apart from the upper semiconductor chip.

10. The semiconductor package of claim 9, wherein a width of the second lower conductive structure is greater than a width of the through via.

11. The semiconductor package of claim 9, wherein the first lower conductive structure includes:
a plurality of lower posts on a top surface at an edge region of the first redistribution substrate; and
a lower partition structure between the second lower conductive structure and the lower posts,
wherein when viewed in plan, the lower partition structure is spaced apart from the lower semiconductor chip and surrounds the lower semiconductor chip.

12. The semiconductor package of claim 11, wherein the lower partition structure is configured to receive a ground voltage.

13. The semiconductor package of claim 9, further comprising a solder bump between the second lower conductive structure and the upper semiconductor chip.

14. The semiconductor package of claim 9, wherein a width of the upper conductive structure is different from a width of the first lower conductive structure.

15. The semiconductor package of claim 9, further comprising:
a second redistribution substrate on the upper semiconductor chip and the upper conductive structure,
wherein the second redistribution substrate is coupled to the upper conductive structure.

16. The semiconductor package of claim 15, further comprising an upper package on the second redistribution substrate,
wherein the upper package includes a first semiconductor chip and the molding pattern.

17. A semiconductor package comprising:
a first redistribution substrate that includes a first dielectric layer, a first seed pattern, and a first conductive pattern on the first seed pattern, the first dielectric layer including a photo-imagable polymer;
a solder ball on a bottom surface of the first redistribution substrate;
a lower semiconductor chip on a top surface of the first redistribution substrate, the lower semiconductor chip including a lower pad, a through via, and an upper pad;
a plurality of lower conductive structures disposed on the first redistribution substrate and laterally spaced apart from the lower semiconductor chip, the lower conductive structures including a first lower conductive structure and a second lower conductive structure that are spaced apart from each other;
an upper conductive structure on the first lower conductive structure;
an upper semiconductor chip on a top surface of the lower semiconductor chip and a top surface of the second lower conductive structure, the upper semiconductor chip being laterally spaced apart from the upper conductive structure; a plurality of first solder bumps between the lower semiconductor chip and the upper semiconductor chip, the first solder bumps being coupled to the upper pad and the upper semiconductor chip;

a second solder bump between the second lower conductive structure and the upper semiconductor chip, the second solder bump being coupled to the second lower conductive structure and the upper semiconductor chip; and a lower molding layer on the first redistribution substrate, the lower molding layer covering a sidewall of the lower semiconductor chip and sidewalls of the lower conductive structures, wherein:

the lower pad is on a bottom surface of the lower semiconductor chip, the through via is in the lower semiconductor chip and is coupled to the lower pad, and the upper pad is on the top surface of the lower semiconductor chip and is coupled to the through via.

18. The semiconductor package of claim 17, wherein:
a second width of the second lower conductive structure is greater than a first width of the through via, the through via is a signal through via, and the second lower conductive structure is configured to receive a voltage.

19. The semiconductor package of claim 18, wherein:
the second width is in a range of about 20 µm to about 200 µm, and a sum of a height of the second lower conductive structure and a height of the upper conductive structure is in a range of about 150 µm to about 950 µm.

20. The semiconductor package of claim 17, further comprising:

an upper molding layer directly on a top surface of the lower molding layer, the upper molding layer covering the upper semiconductor chip and the upper conductive structure, wherein:

the top surface of the second lower conductive structure is at a level substantially the same as a level of the top surface of the lower semiconductor chip, a level of a top surface of the first lower conductive structure, and a level of a top surface of the lower molding layer, and a top surface of the upper conductive structure is at a level substantially the same as a level of a top surface of the upper molding layer.

* * * * *